United States Patent
Sakai et al.

(10) Patent No.: US 9,110,827 B2
(45) Date of Patent: Aug. 18, 2015

(54) ERROR DETECTION AND CORRECTION APPARATUS, MISMATCH DETECTION APPARATUS, MEMORY SYSTEM AND ERROR DETECTION AND CORRECTION METHOD

(71) Applicant: Sony Corporation, Tokyo (JP)

(72) Inventors: Lui Sakai, Kanagawa (JP); Yasushi Fujinami, Tokyo (JP); Naohiro Adachi, Tokyo (JP); Keiichi Tsutsui, Kanagawa (JP); Tatsuo Shinbashi, Tokyo (JP); Ryoji Ikegaya, Kanagawa (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 14/049,248

(22) Filed: Oct. 9, 2013

(65) Prior Publication Data

US 2014/0129904 A1 May 8, 2014

(30) Foreign Application Priority Data

Nov. 2, 2012 (JP) ................................. 2012-242975

(51) Int. Cl.
*H03M 13/00* (2006.01)
*G06F 11/10* (2006.01)
*H03M 13/15* (2006.01)
*H03M 13/37* (2006.01)

(52) U.S. Cl.
CPC ......... *G06F 11/1012* (2013.01); *H03M 13/152* (2013.01); *H03M 13/1515* (2013.01); *H03M 13/373* (2013.01); *H03M 13/6306* (2013.01)

(58) Field of Classification Search
CPC .......... H03M 13/1128; H03M 13/458; H03M 13/1105; H03M 13/1142; H03M 13/2906; H03M 13/3707; H03M 13/3715; H03M 13/3723; H03M 13/6331; H03M 13/4138; H03M 13/15; H03M 13/29; H03M 13/2909; H03M 13/2915; H03M 13/293; H03M 13/455; H03M 13/373; H03M 13/13; H03M 13/1515; H03M 13/6306; H03M 13/152; H04L 1/0052; H04L 1/0064; H04L 1/0051; G06F 11/1008; G06F 11/108; G06F 11/1068; G06F 11/1012; G06F 11/1072; G11B 20/18; G11B 2220/2516; G11B 20/1866; G11B 20/1883; G11B 2220/20; G11C 2211/5641
See application file for complete search history.

(56) References Cited

U.S. PATENT DOCUMENTS

2010/0077279 A1    3/2010    Kim et al.

*Primary Examiner* — Guerrier Merant
(74) *Attorney, Agent, or Firm* — Fishman Stewart Yamaguchi PLLC

(57) ABSTRACT

An error detection and correction apparatus includes a code word read-out unit to execute read processing to read out a code word including a plurality of code elements by detection of an erasure position as read data from a memory address and to execute re-read processing to read out the code word as re-read data from the memory address after a predetermined time is elapsed from the time to read out the read data; a timing control erasure position detection unit to detect a position of the code element having a value not matched as the erasure position in the code word by determining whether or not the value is matched per the code word in the read data and the re-read data; and an error correction unit to correct an error based on the erasure position in the code word where the erasure position is detected.

12 Claims, 28 Drawing Sheets

$$H = \begin{bmatrix} \alpha^{n-1} & \alpha^{n-2} & \cdots & \alpha & 1 \\ \alpha^{2(n-1)} & \alpha^{2(n-2)} & \cdots & \alpha^2 & 1 \\ \vdots & \vdots & & \vdots & \vdots \\ \alpha^{2t(n-1)} & \alpha^{2t(n-2)} & \cdots & \alpha^{2t} & 1 \end{bmatrix}$$

ERROR DETECTION AND CORRECTION APPARATUS, MISMATCH DETECTION APPARATUS, MEMORY SYSTEM AND ERROR DETECTION AND CORRECTION METHOD

CROSS REFERENCE TO RELATED APPLICATIONS

This application claims the benefit of priority under 35 U.S.C. §119 from Japanese Priority Patent Application JP 2012-242975 filed Nov. 2, 2012, the entire contents of each which is incorporated herein by reference.

BACKGROUND

The present technology relates to an error detection and correction apparatus, a mismatch detection apparatus, a memory system and an error detection and correction method. In particular, the present technology relates to an error detection and correction apparatus for detecting and correcting an error in data read out from a non-volatile memory, a mismatch detection apparatus, a memory system and an error detection and correction method.

In a recent information processing system, an NVM (non-volatile memory) will be used as an auxiliary storage device or storage. Examples of the non-volatile memory include a flash memory, a ReRAM (Resistance RAM), a PCRAM (Phase-Change RAM) and an MRAM (Magnetoresistie RAM). In the non-volatile memory, recorded data may be broken due to a thermal noise and may not be read out correctly. For this reason, a data storage device generates an ECC (Error detection and Correction Code) from data to be recorded to record it on the non-volatile memory. The data storage device can detect and correct a data error based on the ECC when data is regenerated.

In the error detection and correction, there is proposed a system where data is read out a plurality of times using different threshold voltages, each data is compared to detect erasure, and correct an error based on the erasure detected (for example, see United States Patent Application Publication No. 2010/0077279).

SUMMARY

However, in the above-described related technology, the data error may not be correct accurately. For example, in the non-volatile memory, a random telegraph noise that fluctuates a recorded data value depending on a time may be generated. Once the random telegraph noise is generated, each data read out at the same threshold voltage may have a different value at the time of reading out. In the above-described system that compares each data read out at the different threshold voltage, such an error cannot be detected. For this reason, the data error may not be corrected accurately.

In view of the circumstances as described above, there is a need for a technology that the data error is corrected accurately.

According to an embodiment of the present technology, there is provided an error detection and correction apparatus and an error detection and correction method by the error detection and correction apparatus, including a code word read-out unit to execute read processing to read out a code word including a plurality of code elements that improve error correction capability by detection of an erasure position as read data from a memory address and to execute re-read processing to read out the code word as re-read data from the memory address after a predetermined time is elapsed from the time to read out the read data; a timing control erasure position detection unit to detect a position of the code element having a value not matched as the erasure position in the code word by determining whether or not the value is matched per the code word in the read data and the re-read data; and an error correction unit to correct an error based on the erasure position in the code word where the erasure position is detected. The position of the code element having the value not matched is detected as the erasure position in the code word in the read data and the re-read data, and the error in the code word having the detected erasure position is corrected.

In the error detection and correction apparatus, the error correction unit may correct the error such that the number of positions that correspond to a difference between a total number of the erasure positions and the predetermined number among the detected erasure positions is not the erasure position when the total number of the detected erasure positions exceeds the predetermined number corresponding to the error correction capability. When the total number of the detected erasure positions exceeds the predetermined number, the error is corrected such that the number of positions that correspond to the difference between the total number of the erasure positions and the predetermined number among the detected erasure positions is not the erasure position.

In the error detection and correction apparatus, a data replacement unit that replaces the code element with data having a certain value at the erasure position where the number corresponding to the difference and supplies it to the error correction unit when the total number of the detected erasure positions exceeds the predetermined number may be further included, and the error correction unit may correct the error such that the position replaced with the data having the certain value is not the erasure position. The code element is replaced with data having the certain value at the erasure position where the number corresponding to the difference between the total number of the erasure positions and the predetermined number, and the error is corrected such that the position is not the erasure position.

In the error detection and correction apparatus, the certain value may be determined based on a probability to invert one value of two values of the code element to the other value and a probability to invert the other value of the code element to the one value. The certain value is determined based on the probability to invert one value of two values of the code element to the other value and the probability to invert the other value of the code element to the one value.

In the error detection and correction apparatus, a threshold value control read-out unit to control a threshold value to a first value for determining the value of the code element held at the memory address having either of two values, to read out the code word from the memory address as first data, to control the threshold value to a second value different from the first value, and to read out the code word from the memory address as second data; and a threshold value control erasure position detection unit to determine whether or not the value is matched per the code element in the first and second data and to detect the position of the code element having the value not matched as the erasure position in the code word may be further included, and the error correction unit may correct the error in the cord word where the erasure position is detected by the timing control erasure position detection unit, and the cord word where the erasure position is detected by the threshold value control erasure position detection unit. The position of the code element having the value not matched in the first and second data is detected as the erasure position in the code element.

In the error detection and correction apparatus, a read data error detection unit to detect an error in the read data when the code word read-out unit executes the read processing may be further included, and the code word read-out unit may executes the re-read processing when the error is detected by the read data error detection unit. When the read processing is executed, the error, if any, in the read data is detected. Once the error is detected, the re-read processing is executed.

In the error detection and correction apparatus, a temperature acquisition unit to acquire a temperature; and a determination unit to determine a length of the predetermined time depending on the temperature before the read processing is executed may be further included, and the code word read-out unit may executes the read processing when the length of the predetermined time is determined. The read processing is executed when the length of the predetermined time is determined depending on the temperature.

According to another embodiment of the present technology, there is provided a mismatch detection apparatus, including a code word read-out unit to execute read processing to read out a code word including a plurality of code elements as read data from a memory address and to execute re-read processing to read out the code word as re-read data from the memory address after a predetermined time is elapsed from the time to read out the read data; a mismatch detection unit to detect whether or not the read data and the re-read data are mismatched; and a register unit to register the memory address where the mismatch is detected as a defect address to which an access is inhibited. When the read data and the re-read data are mismatched, the memory address is registered as the defect address.

In the error detection and correction apparatus, the mismatch detection unit may determine whether or not the value is mismatched per the code element, and the register unit may register the memory address as the defect address when the number of the code element that is determined as a mismatch exceeds a predetermined threshold value. When the number of the code element that is determined as the mismatch exceeds the predetermined threshold value, the memory address is registered as the defect address.

According to still another embodiment of the present technology, there is provided a mismatch detection apparatus, including a supply unit to supply a plurality of times having different lengths as candidate times sequentially; a code word read-out unit to execute read processing to read a code word including a plurality of code elements from a memory address as read data and re-read processing to read out the code words from the memory address as re-read data after the candidate time is elapsed from the time to read out the read data a certain number of times every time the candidate times are set; a mismatch detection unit to detect whether or not the read data and the re-read data are mismatched each time the read processing and the re-read processing are executed; a counter to count the number of times of the mismatch detection in the plurality of times; and a setting unit to set the time having a highest detection frequency of the mismatch from the plurality of times based on the detection number of times. The time having the highest detection frequency of the mismatch is set.

According to yet another embodiment of the present technology, there is provided a memory system including a memory to store a code word including a plurality of code elements that improves error correction capability by detection of an erasure position to a memory address; a code word read-out unit to execute read processing to read out a code word including a plurality of code elements as read data from a memory address and to execute re-read processing to read out the code word as re-read data from the memory address after a predetermined time is elapsed from the time to read out the read data; a timing control erasure position detection unit to detect a position of the code element having the value not matched as the erasure position in the code word by determining whether or not the value is matched per the code word in the read data and the re-read data; and an error correction unit to correct an error based on the erasure position in the code word where the erasure position is detected. The position of the code element having the value not matched is detected as the erasure position in the read data and the re-read data, and the error is corrected based on the erasure position in the code word where the erasure position is detected.

According to the embodiments of the present technology, the error in the data can be corrected accurately.

These and other objects, features and advantages of the present technology will become more apparent in light of the following detailed description of best mode embodiments thereof, as illustrated in the accompanying drawings.

DETAILED DESCRIPTION OF EMBODIMENTS

Hereinafter, an embodiment of the present technology will be described with reference to the drawings.

The embodiments of the present technology will be described in the following order.
1. First Embodiment (an example of detecting and correcting an erasure position)
2. Second Embodiment (an example of detecting an erasure position and displacing and correcting data)
3. Third Embodiment (an example of detecting and correcting an erasure position while controlling a threshold value)
4. Fourth Embodiment (an example of detecting a mismatch and access controlling)
5. Fifth Embodiment (an example of determining an RTN cycle and detecting and correcting an erasure position)
6. Sixth Embodiment (an example of determining an RTN cycle depending on a temperature and detecting and correcting an erasure position)<

Figure 1:
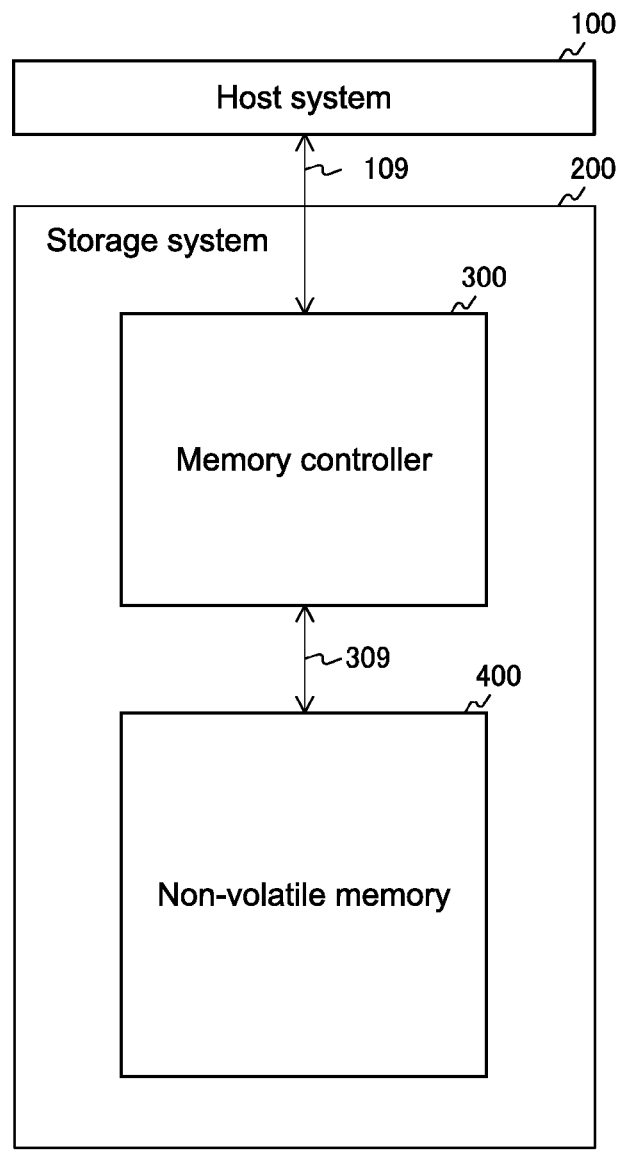
FIG. 1 is a block diagram showing a configuration example of an information processing system according to a first embodiment.

<1. First Embodiment>
[Configuration Example of Information Processing System]
FIG. 1 is a block diagram showing a configuration example of an information processing system according to a first embodiment. The information processing system includes a host system 100 and a storage system 200.

The host system 100 controls the entire information processing system. Specifically, the host system 100 generates a command and write data, and supplies them to the storage system 200 via a signal line 109. The host system 100 receives read data from the storage system 200. Here, the command is for controlling the storage system 200, and includes a write command for instructing writing of the write data and a read command for instructing reading-out of the read data.

The storage system 200 includes a memory controller 300 and a non-volatile memory 400. The memory controller 300 is for controlling the non-volatile memory 400. When the write command and the write data are received from the host system 100, the memory controller 300 generates an ECC (Error detection and Correction Code) from the write data. Specifically, the memory controller 300 converts (i.e., encodes) the write data into a cord word including the write data and a parity. The memory controller 300 accesses to the non-volatile memory 400 through a signal line 309, and writes the encoded data into the non-volatile memory 400.

Also, when the read command is received from the host system 100, the memory controller 300 accesses to the non-volatile memory 400 through the signal line 309, and reads out the encoded data. Then, the memory controller 300 converts (i.e., decodes) the encoded data into original data before encoding. In addition, the memory controller 300 detects and corrects an error in the data based on the ECC. The memory controller 300 supplies the corrected data to the host system 100.

The memory controller 300 is an example of the error detection and correction apparatus according to an embodiment of the present technology.

The non-volatile memory 400 stores data being controlled by the memory controller 300. For example, a ReRAM is used as the non-volatile memory 400. The non-volatile memory 400 includes a plurality of memory cells. These memory cells are divided into a plurality of blocks. Here, the block is an access unit of the non-volatile memory 400, and is also called as "a sector". A memory address is allocated to each of the blocks. Instead of the ReRAM, a flash memory, a PCRAM, an MRAM or the like may be used as the non-volatile memory.

Figure 2:
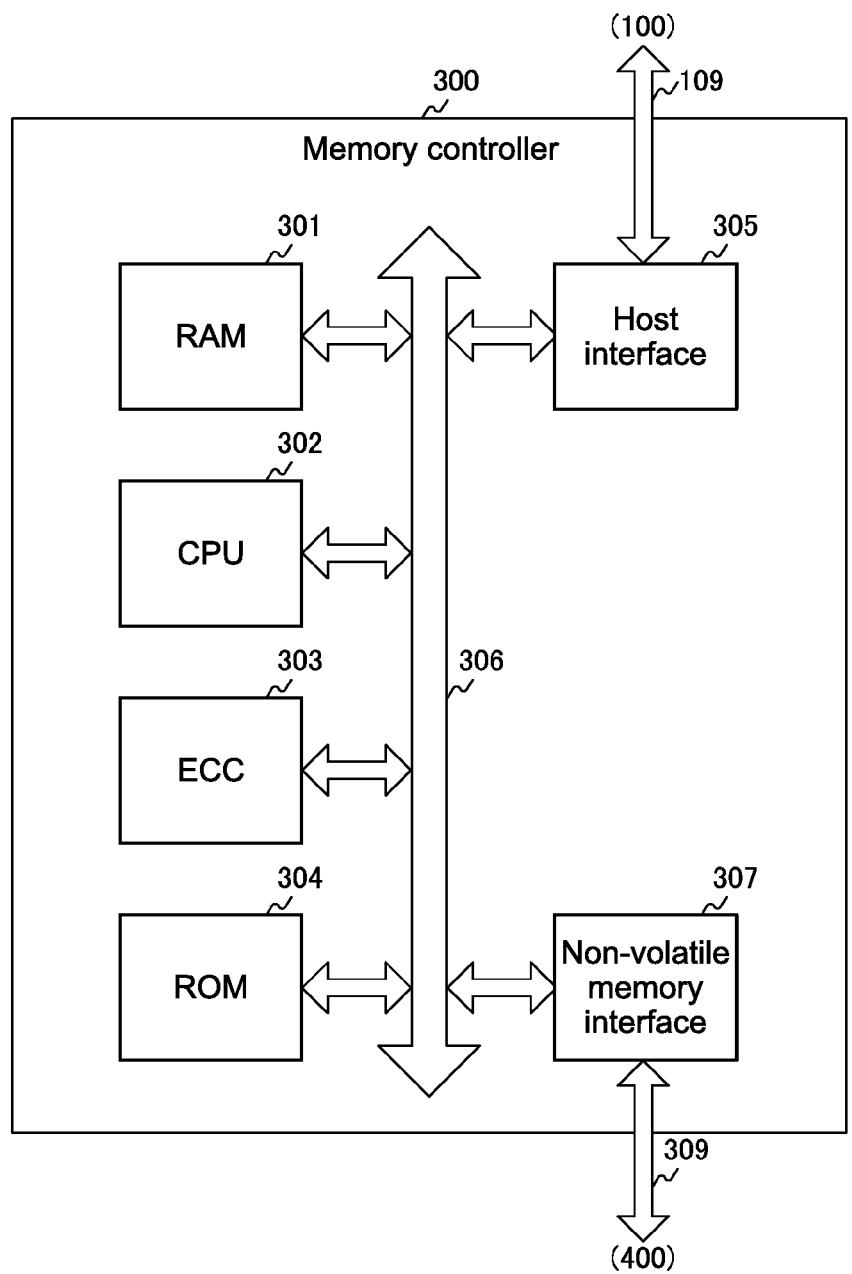
FIG. 2 is a block diagram showing a configuration example of a memory controller according to the first embodiment.

[Configuration Example of Memory Controller]
FIG. 2 is a block diagram showing a configuration example of a memory controller 300 according to the first embodiment. The memory controller 300 includes an RAM (Random Access Memory) 301, a CPU (Central Processing Unit) 302, an ECC processing unit 303 and a ROM (Read Only Memory) 304. Further, the memory controller 300 includes a host interface 305, a bus 306 and a non-volatile memory interface 307.

The RAM 301 temporarily holds data necessary for processing executed by the CPU 302. The CPU 302 controls the entire memory controller 300. The ROM 304 stores a program etc. executed by the CPU 302. The host interface 305 exchanges data or a command with the host system 100. The bus 306 is a common path to mutually exchange data among the RAM 301, the CPU 302, the ECC processing unit 303, the ROM 304, the host interface 305 and the non-volatile memory interface 307. The non-volatile memory interface 307 mutually exchange data or a command with the non-volatile memory 400.

The ECC processing unit 303 encodes the write data and decodes the read data. Upon encoding the write data, the ECC processing unit 303 uses each of a plurality of data as data to be encoded, and adds a parity to the data to be encoded, thereby encoding the data in a predetermined unit. Each encoded data in a predetermined unit is referred to as "a code word". Then, the ECC processing unit 303 supplies the encoded write data to the non-volatile memory 400 via the bus 306.

Also, the ECC processing unit 303 decodes the encoded read data to the original data to be encoded. Upon decoding, the ECC processing unit 303 detects and corrects an error of the code word using the parity. The ECC processing unit 303 supplies the decoded data to be encoded to the host system 100 via the bus 306.

Figure 3:
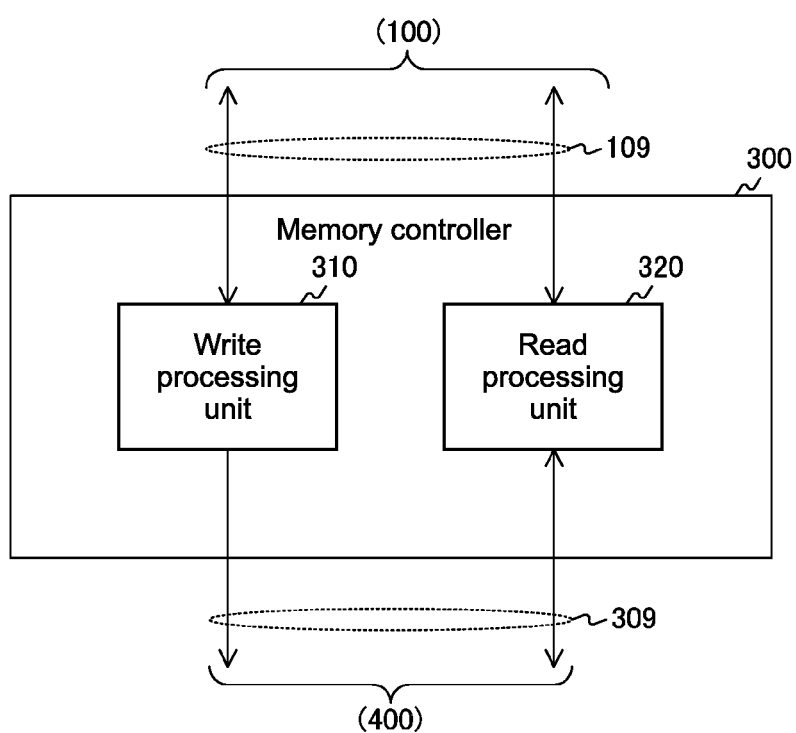
FIG. 3 is a block diagram showing a configuration example of the memory controller according to the first embodiment.

FIG. 3 is a block diagram showing a configuration example of the memory controller 300 according to the first embodiment. The memory controller 300 includes a write processing unit 310 and a read processing unit 320. The write processing unit 310 shown in FIG. 3 is realized by the RAM 301, the CPU 302, the ECC processing unit 303, the ROM 304, the host interface 305, the bus 306, the non-volatile memory interface 307 etc. The same applies to the read processing unit 320.

The write processing unit 310 executes writing of the write data into the non-volatile memory 400 in accordance with the write command. When the write processing unit 310 receives the write command and the write data from the host system 100, the write processing unit 310 uses the write data as the data to be encoded and encodes the data to be encoded to the cord word. Upon encoding, the data to be encoded is encoded to, for example, a binary BCH code having a root $\alpha^i$. Here, the "i" is an integer of 1 or 2t, where t is an integer. The "$\alpha$" is of an element of a galois field GF ($2^m$). In the binary BCH code, each $\alpha^i$ takes a value "1" or "0". In encoding of the BCH code, a generating polynomial by the following Expression 1 is used, for example.

$$G(x)=LCM[M_1(x), M_2(x), \ldots, M_{2t}(x)]$$  Expression 1

In Expression 1, LCM[ ] represents a least common multiple polynomial of each polynomial in [ ]. Mi(x) is a least polynomial on the galois field GF ($2^m$) of $\alpha^i$.

The write processing unit 310 generates a code polynomial from the data to be encoded, and determines a remainder by dividing the code polynomial by the generating polynomial shown in Expression 1. The code polynomial is a polynomial having a factor of each bit value of the data to be encoded. The write processing unit 310 generates data of each factor in the remainder determined as a parity, and outputs the data to be encoded and the parity data as the code word to the non-volatile memory 400.

Also, the write processing unit 310 may encode not by polynomial operation using the generating polynomial, but by matrix operation. The write processing unit 310 encodes the write data to the binary BCH code, and may encode the write data to the code other than the BCH code as long as the code has an error correction capability. The write processing unit 310 may encode the write data to an RS (Reed-Solomon) code or a convolutional code. Also, the write processing unit 310 may encode the write data to a higher dimensional code than the binary code.

The read processing unit 320 executes reading out of the read data from the non-volatile memory 400 in accordance with the read command. When the read processing unit 320 receives the read command from the host system 100, the read processing unit 320 reads out the code word from a memory address designated by the command as the read data. The read processing unit 320 decodes the read data to the original data to be encoded. Upon decoding, the read processing unit 320 corrects an error in the read data using a parity included in the read data. A method of correcting an error will be described later in detail. The read processing unit 320 outputs the decoded data to be encoded to the host system 100.

Figure 4:
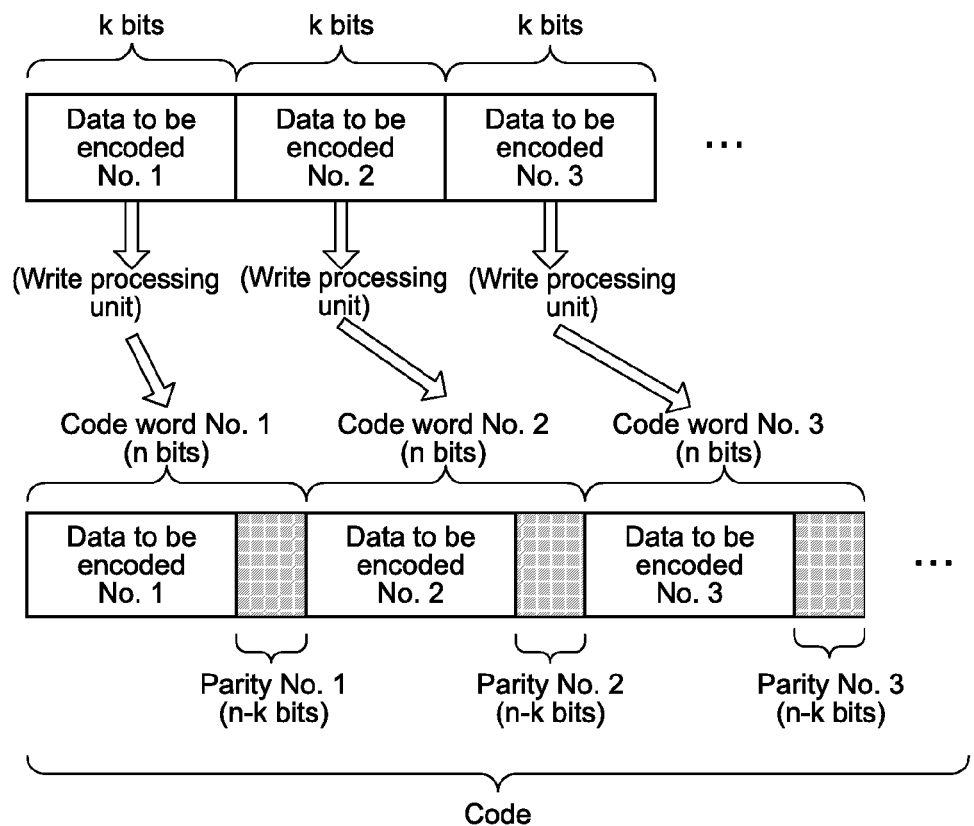
FIG. 4 is a diagram showing an example of a data configuration of a code word according to the first embodiment.

FIG. 4 is a diagram showing an example of a data configuration of the code word according to the first embodiment. As shown in FIG. 4, the write processing unit 310 encodes each of the data to be encoded having k bits to the code word having n bits. Here, k is an integer, and n is an integer greater than k. Each code word includes the data to be encoded having k bits and a parity of n-k bits. When the code word includes the data to be encoded as it is and can be easily separated into the data to be encoded and the parity, the code is referred to as a systematic code. But, the code may be non-systematic code.

[Configuration Example of Read Processing Unit]

Figure 5:
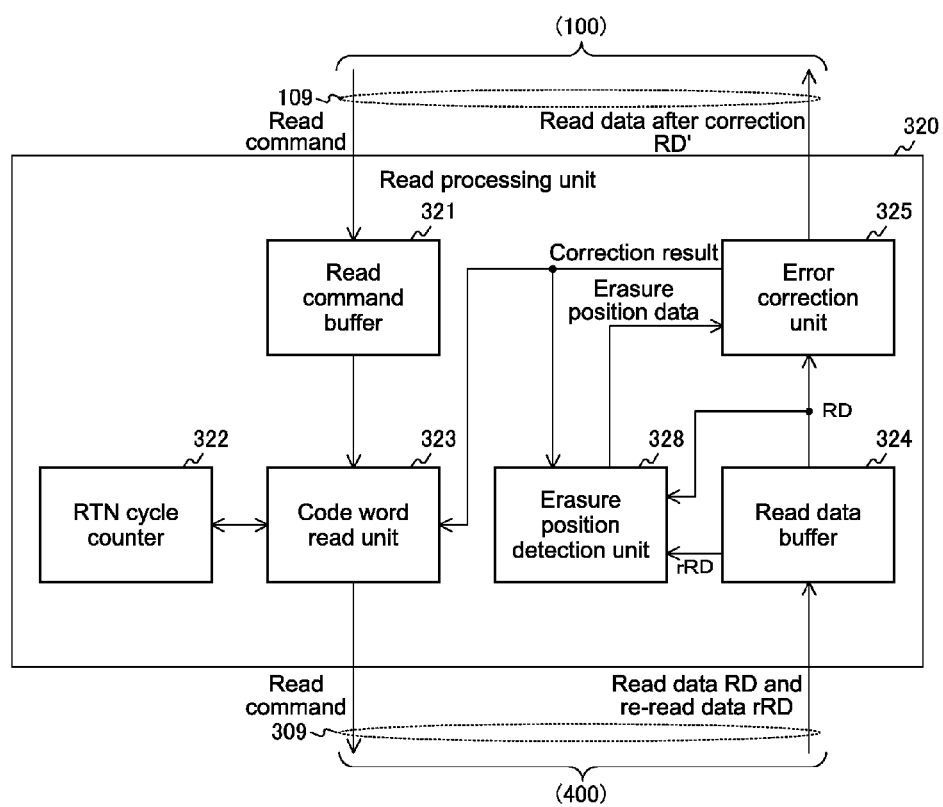
FIG. 5 is a block diagram showing a configuration example of a read processing unit according to the first embodiment.

FIG. 5 is a block diagram showing a configuration example of the read processing unit 320 according to the first embodiment. The read processing unit 320 includes a read command buffer 321, an RTN cycle counter 322, a code word read unit 323, a read data buffer 324, an error correction unit 325 and an erasure position detection unit 328.

The read command buffer 321 holds the read command received from the host system 100.

The RTN cycle counter 322 counts an RTN cycle. The RTN cycle is a cycle of fluctuating a data value by a random telegraph noise. The RTN cycle is set such that a frequency of detecting a mismatch by the RTN becomes highest in the same type of the memory as the non-volatile memory 400.

The code word read unit 323 reads out the data per a code word unit from the non-volatile memory 400. Specifically, the code word read unit 323 acquires the read command from the read command buffer 321, outputs the read command to the non-volatile memory 400, and reads out the code word from the memory address as read data RD. Also, the code word read unit 323 sends the read command to start counting by the RTN cycle counter 322.

Then, the code word read unit 323 receives a result of an error correction about the read data read out from the error correction unit 325. If the correction is successful, the code word read unit 323 initializes a counter value of the RTN cycle counter 322. On the other hand, when the correction is failed, the code word read unit 323 refers to the counter value of the RTN cycle counter, and determines whether or not the RTN cycle is elapsed from the output of the read command. If the RTN cycle is elapsed, the code word read unit 323 acquires the read command from the read command buffer 321, outputs the read command to the non-volatile memory 400, and reads out the cord word from the memory address as re-read data rRD. The code word read unit 323 is an example of the claimed code word read-out unit.

The read data buffer 324 holds the read data RD and the re-read data rRD read out from the non-volatile memory 400.

The error correction unit 325 corrects an error in the read data RD. When the read data RD is read out by the read data buffer 324, the error correction unit 325 detects and corrects the error in the read data RD using the parity included in the read data RD. A correction result showing that the correction is successful or not is supplied by the error correction unit 325 to the code word read unit 323 and the erasure position detection unit 328.

If the error correction of the read data RD is successful, the error correction unit 325 outputs data RD' where the parity is removed from the corrected read data to the host system 100. On the other hand, if the correction is failed, the error correction unit 325 receives the erasure position data from the erasure position detection unit 328. The erasure position data shows an erasure position where the data is erased in the read data RD. For example, the erasure position data is generated as the data having the same size as the read data RD, a bit value of "1" at the erasure position, and a bit value of "0" not at the erasure position.

Once the error correction unit 325 receives the erasure position data, the error correction unit 325 executes an erasure correction based on the erasure position shown by the erasure position data. Here, the erasure correction is correction processing to determine a data value at the erasure position such that the data is erased at the erasure position. The erasure correction is executed on the presumption that the erasure position is detected. The error correction unit 325 outputs the data RD' where the parity is removed from the erasure corrected read data to the host system 100.

The error correction capability in the erasure correction is higher, i.e., two times greater, than the error correction capability when the erasure position is unclear. Here, the error correction capability is the number of code elements (for example, bits) that can be corrected per the code word. The code element is a minimum unit constituting the code word, and is also called as a symbol.

The error correction capability is determined by a minimum hamming distance $d_{min}$. The minimum hamming distance $d_{min}$ is a minimum value of the hamming distance between any different code words to which the code belongs. If a maximum value of t (integer) satisfying $2t+1<=d_{min}$ is $t_{max}$ the code elements can be corrected to the $t_{max}$ when the erasure position is unclear. The rule is called as a bounded distance decoding algorithm.

On the other hand, in the erasure correction where the erasure position is detected, the number of the erasure position is h, and the number of the errors where the position is unclear is t. Then, both can be corrected as long as $2t+h+1<=d_{min}$ is true. In other words, the code elements can be corrected to $h_{max}$ that is a maximum value of h (integer) satisfying $h+1<=d_{min}$ when t=0. Since $h_{max}$ is greater than $t_{max}$, the error correction capability of the code word is higher when the erasure position is detected as compared with when the erasure position is not detected.

The erasure position detection unit 328 detects the erasure position of the code word. When the erasure position detection unit 328 receives the correction result showing that the correction of the read data RD is failed, the erasure position detection unit 328 acquires the read data RD and the re-read data rRD from the read data buffer 324. As described above, since the re-read data rRD is read out after the RTN cycle is elapsed from the time to read out the read data RD, the re-read data rRD may have a different value when the random telegraph noise is generated in the RTN cycle. For this reason, the erasure position detection unit 328 can detect the bit position where the data is erased by determining whether or not the value is matched per the bit in the read data RD and the re-read data rRD. The erasure position detection unit 328 supplies the erasure position data showing the detected erasure position to the error correction unit 325.

The memory controller 300 is configured to detect the erasure position and to correct the error, but the non-volatile memory 400 may be configured to execute these processings.

Figures 6, 7:
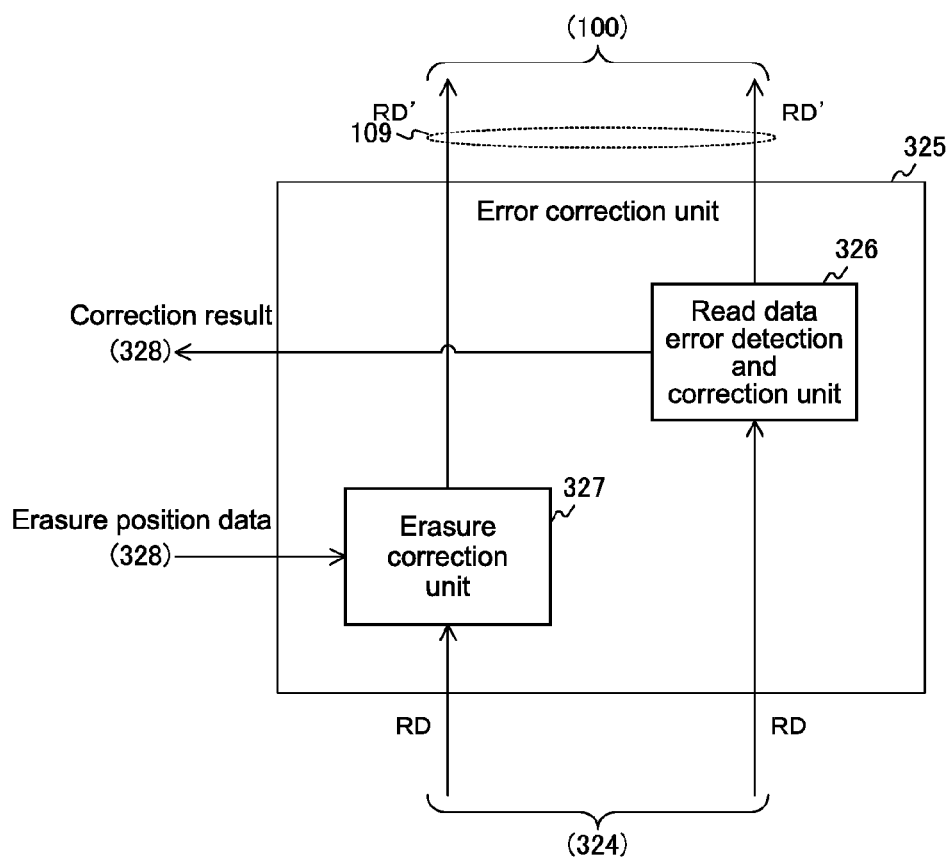
FIG. 6 is a diagram showing an example of a check matrix of a BCH code according to the first embodiment.
FIG. 7 is a block diagram showing a configuration example of an error correction unit according to the first embodiment.

FIG. 6 is a diagram showing an example of a check matrix of the BCH code according to the first embodiment. The check matrix is used for detecting the code error. In the BCH code, the error of the code word is detected by multiplying the check matrix as shown in FIG. 6 by the code word.

Configuration Example of Error Correction Unit

FIG. 7 is a block diagram showing a configuration example of the error correction unit 325 according to the first embodiment. The error correction unit 325 includes a read data error detection and correction unit 326 and an erasure correction unit 327.

The read data error detection and correction unit 326 detects and corrects the error in the read data RD. If the error is corrected in the BCH code, the read data error detection and correction unit 326 detects the error position in the code word using the parity included in the code word (the read data RD). Specifically, the read data error detection and correction unit 326 determines a syndrome from the code word and the check matrix as shown in FIG. 6. Here, the syndrome is a vector obtained by multiplying the received code word by the check matrix, and is used for determining the error position.

The above-described matrix operation for determining the syndrome can be represented by the following Expression 2:

$$s_i = Y(\alpha^i), i=1, \ldots, 2t \quad \text{Expression 2}$$

In Expression 2, Y(x) is a receive polynomial having a factor of each bit value of the read data. $S_i$ represents the syndrome.

If the syndrome $S_i$ is entirely "0", the read data error detection and correction unit 326 determines that the read data has no error. In this case, the read data error detection and correction unit 326 supplies the data RD' where the parity is removed from the read data RD to the host system 100.

On the other hand, if any syndrome $S_i$ is not "0", the read data error detection and correction unit 326 determines that the read data has an error. In this case, in order to determine the error position, the read data error detection and correction unit 326 generates the following Expressions 3 and 4:

$$\sigma(z) = (1 - \alpha^{j1}z)(1 - \alpha^{j2}z) \ldots (1 - \alpha^{jL}z) \quad \text{Expression 3}$$

$$\omega(z) = \sum_{i=1}^{L} e_i \alpha^{ji} \prod_{\substack{k=1 \\ k \neq i}}^{L} (1 - \alpha^{jk}z) \quad \text{Expression 4}$$

In Expressions 3 and 4, each j1 to jL represents the error position. If the number of the error position, i.e., the error number, is within the error correction capability t, the error correction is successful. In Expression 4, $\pi_x$ means an infinite product of x, and $e_i$ represents a code element value at the error position.

By determining a root of σ(z) in Expression 4, the error position can be determined. Therefore, the σ(z) is called as an error position polynomial. Also, the error position value can be determined by ω(z) in Expression 5. Therefore, the ω(z) is called as an error evaluation polynomial.

The read data error detection and correction unit 326 generates the following Expression 5 from Expressions 3 and 4 generated.

$$\sigma(z)S(z) \equiv \omega(z) \bmod z^{2t} \quad \text{Expression 5}$$

In Expression 5, AmodB means a remainder by dividing A by B. S(z) is a polynomial having a factor of each syndromes $S_i$.

The read data error detection and correction unit 326 determines the σ(z) and the ω(z) satisfying generated Expression 5 and the following Expressions 6 to 8. The σ(z) and the ω(z) satisfying Expressions 5 to 8 can be determined by a Peterson's algorithm, an Euclid's algorithm or the like.

$$\left. \begin{array}{l} deg\sigma(z) \leq t \\ deg\omega(z) \leq t-1 \end{array} \right\} \quad \text{Expression 6}$$

$$LCM[\omega(z), \sigma(z)] = \text{Constant} \quad \text{Expression 7}$$

$$\sigma(0) = 1 \quad \text{Expression 8}$$

In Expression 7, degF(z) shows a maximum degree of a polynomial F(z).

If there are no σ(z) and ω(z) satisfying Expressions 5 to 8, it is determined that the error correction is failed because there are the number of the errors exceeding the error correction capability. The read data error detection and correction unit 326 supplies the correction result that the correction is failed to an erasure position detection unit 328.

On the other hand, if there are the σ(z) and the ω(z) satisfying Expressions 5 to 8, the read data error detection and correction unit 326 determines roots $\alpha^{-j1}$ to $\alpha^{-jL}$ of σ(z). The read data error detection and correction unit 326 detects j1 to jL as the error positions corresponding to these roots. The read data error detection and correction unit 326 corrects the error by inverting each bit at the detected error positions. The read data error detection and correction unit 326 supplies the data RD' where the parity is removed from the corrected read data RD to the host system 100.

If the BCH code having a higher dimensional code than the binary code is used, it is necessary to determine a value $e_i$ of a code element (symbol) at the position in addition to the error position. In this case, the value $e_i$ of the code element can be determined by the following Expressions 9 and 10:

$$e_i = -\frac{\omega(\alpha^{-ji})}{\sigma'(\alpha^{-ji})}, i = 1, \ldots, L \qquad \text{Expression 9}$$

$$\sigma'(z) = -\sum_{i=1}^{L} \alpha^{ji} \prod_{\substack{k=1 \\ k \neq i}}^{L} (1 - \alpha^{jk} z) \qquad \text{Expression 10}$$

In Expressions 9 and 10, $\sigma'(z)$ is a derivative of the $\sigma(z)$.

Although the read data error detection and correction unit 326 has a configuration that detects and corrects the error, only the detection of the error may be executed without the correction. The read data error detection and correction unit 326 is an example of the claimed read data error detection unit.

The erasure correction unit 327 erases and corrects the read data RD based on the erasure position data. The erasure correction unit 327 receives the erasure position data from the erasure position detection unit 328, and then acquires the read data RD from the read data buffer 324. Then, the erasure correction unit 327 generates the following Expressions 11 and 12 based on the erasure position shown by the erasure position data.

$$\lambda(z) = (1 - \alpha^{j1'} z)(1 - \alpha^{j2'} z) \ldots (1 - \alpha^{jh'} z) \qquad \text{Expression 11}$$

$$\psi(z) = \omega(z)\lambda(z) + \sigma(z) \sum_{i=1}^{h} e_{i'} \alpha^{ji'} \prod_{\substack{k=1 \\ k \neq i}}^{h} (1 - \alpha^{jk'} z) \qquad \text{Expression 12}$$

In Expressions 11 and 12, each of j1' to jh' is the erasure position.

Also, the erasure correction unit 327 determines the syndrome from the read data RD using Expression 2. The erasure correction unit 327 generates Expression 13 from the generated Expressions 11 and 12 and the syndrome.

$$\sigma(z)\lambda(z)S(z) \equiv \psi(z) \bmod z^{d-1} \qquad \text{Expression 13}$$

Here, when $2t+h+1 \leq d_{min}$ is true where the number of the error where the position is not detected is t, the number of the erased code element is h, a minimum hamming distance is $d_{min}$, $\sigma(z)$ in Expression 21 becomes a degree of t or less. For this reason, $\deg \sigma(z) \leq t$ is true. The erasure correction unit 327 determines the $\sigma(z)$ that satisfies $\deg \sigma(z) \leq t$ and Expressions 7 and 8, and $\psi(z)$ that satisfies the Expression 13. The $\sigma(z)$ and the $\psi(z)$ can be determined by a Peterson's algorithm, an Euclid's algorithm or the like.

When there are the $\sigma(z)$ and the $\psi(z)$ satisfying the conditions, the erasure correction unit 327 determines a bit value $e_1$ at an erasure position ji' using the following Expression 14 from the determined $\sigma(z)$ and $\psi(z)$. The erasure correction unit 327 corrects the bit value at the erasure position ji' to the determined value in the read data RD.

$$e_{i'} = -\frac{\psi(\alpha^{-ji'})}{\lambda'(\alpha^{-ji'})\sigma(\alpha^{-ji'})}, i' = 1', \ldots, h' \qquad \text{Expression 14}$$

In Expression 14, $\lambda'(z)$ is a derivative of the $\lambda(z)$

The erasure correction unit 327 detects each of j1 to jL corresponding to the roots $\alpha^{-j1}$ to $\alpha^{-jL}$ of the $\sigma(z)$ as the error position, and inverts each bit at these positions. Then, the erasure correction unit 327 outputs the data RD' where the parity is removed from the corrected read data RD to the host system 100.

When there are no $\sigma(z)$ and $\psi(z)$ satisfying the conditions, the erasure correction unit 327 determines that the error correction is failed because the number of the errors generated exceeds the error correction capability. In this case, the erasure correction unit 327 outputs the read error notifying that the read data cannot be accurately read out to the host system 100.

If the BCH code having a higher dimensional code than the binary code is used, it is necessary to determine a value of a code element (symbol) at the error position. In this case, the value $e_i$ of the code element at the error position ji can be determined, for example, by the following Expression 15:

$$e_i = -\frac{\psi(\alpha^{-ji})}{\sigma'(\alpha^{-ji})\lambda(\alpha^{-ji})}, i = 1, \ldots, L \qquad \text{Expression 15}$$

Figure 8A:
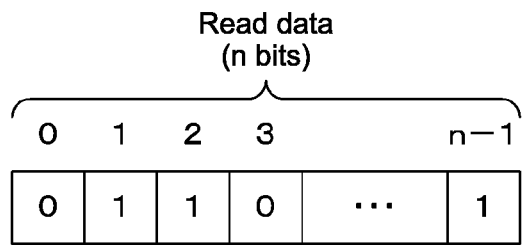
FIGS. 8A, 8B and 8C A are each an example of read data, re-read data, and erasure position data.
Figure 8B:
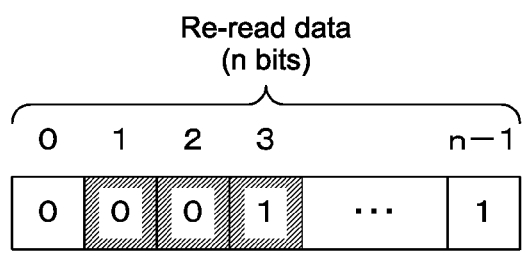
Figure 8C:
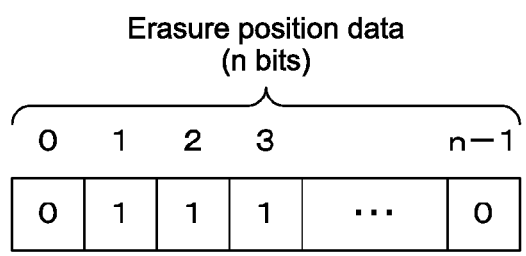

FIGS. 8A, 8B and 8C each shows an example of the read data, the re-read data and the erasure position data according to the first embodiment. FIG. 8A is an example of the read data. FIG. 8B is an example of the re-read data. As an example, the read data is "0110" at 0 to 3 bits and the re-read data is "0001" at 0 to 3 bits.

If the error correction of the read data is failed, the erasure position detection unit 328 determines whether or not the value is matched with each bit in the read data and the re-read data. The position where the value is not matched is detected as the erasure position. In FIGS. 8A and 8B, the values at 1 to 3 bits are not matched, and these positions are detected as the erasure positions.

The erasure position detection unit 328 generates the erasure position data showing the detected erasure position. FIG. 8C shows an example of the erasure position data. A data size (n bits) of the erasure position data equals to a size of the read data. The bits at the matched position are set to "0", and the bits at the mismatched position (i.e., at the erasure position) are set to "1". For example, if the values at the 1 to 3 bits are mismatched, the bits are set to "1", and the rest bits are set to "0". Thus, such erasure position data is generated. The data configuration of the erasure position data is not limited to the configuration shown in FIGS. 8A to 8C.

[Operation Example of Memory Controller]

Figure 9:
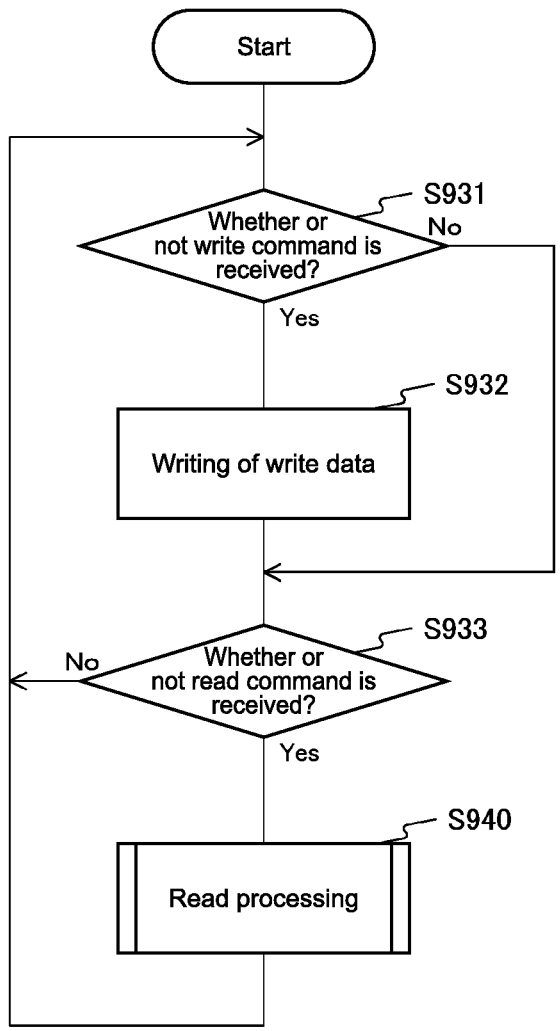
FIG. 9 is a flow chart showing an example of operation of a memory controller according to the first embodiment.

FIG. 9 is a flow chart showing an example of operation of the memory controller 300 according to the first embodiment. The operation is started after the memory controller 300 is turned on.

The memory controller 300 determines whether or not the write command is received from the host system 100 (Step S931). If the write command is received (Step S931: Yes), the memory controller 300 encodes and writes the write data into the non-volatile memory 400 (Step S932).

If the write command is not received (Step S931: No) or after Step S932, the memory controller 300 determines whether or not the read command is received (Step S933). If the read command is received (Step S933: Yes), the memory controller 300 executes read processing to read out the encoded read data (Step S940). If the read command is not received (Step S933: No) or after Step S940, the memory controller 300 returns to Step S931.

Figure 10:
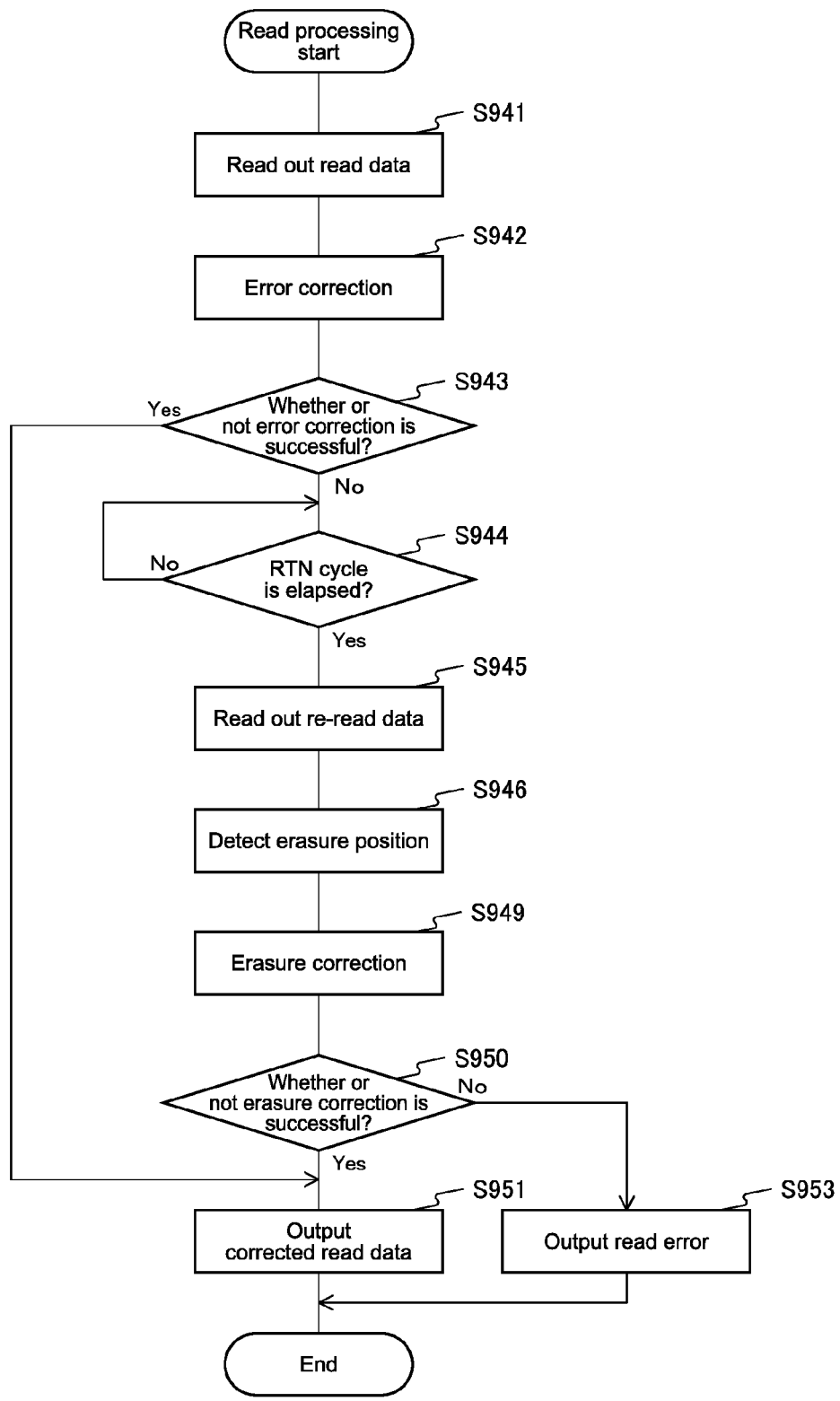
FIG. 10 is a flow chart showing an example of read processing according to the first embodiment.

FIG. 10 is a flow chart showing an example of the read processing according to the first embodiment. The memory controller 300 reads out the code word from the memory address designated by the read command as the read data (Step S941). The memory controller 300 executes the error detection and the correction in the read data (Step S942). The memory controller 300 determines whether or not the error correction is successful or not (Step S943).

If the error correction is failed (Step S943: No), the memory controller 300 determines whether or not the RTN cycle is elapsed from the time to read out the read data (Step S944). If the RTN cycle is not elapsed (Step S944: No), the memory controller 300 returns to Step S944. On the other hand, the RTN cycle is elapsed (Step S944: Yes), the memory controller 300 read out the code word from the same memory address as the re-read data (Step S945).

The memory controller 300 detects the erasure position by determining whether or not the value is matched per the bit in the read data and the re-read data (Step S946). Then, the memory controller 300 executes the erasure correction in the read data based on the detected erasure position (Step S949). The memory controller 300 determined whether or not the erasure correction is successful or not (Step S950).

If the error correction is successful (Step S943: Yes) or if the erasure correction is successful (Step S950: Yes), the memory controller 300 outputs the corrected read data to the host system 100 and ends the read processing (Step S951). On the other hand, if the erasure correction is failed (Step S950: No), the memory controller 300 outputs the read error to the host system 100 and ends the read processing (Step S953).

As described above, according to the first embodiment, the memory controller 300 can detect the erasure position from the read data and the re-read data read out after the RTN cycle is elapsed from the time to read out the read data, and correct the error of the code word. In this way, the error caused by the random telegraph noise can be detected and corrected after the RTN cycle is elapsed. In addition, the error correction capability of the code is improved by the detection of the erasure position, whereby the memory controller 300 can correct the data more accurately. In the first embodiment, it is assumed that the error correction time is longer than the RTN cycle, and the RTN cycle is waited at Step S944 after it is confirmed that the error correction at Step S943 is failed. However, if the error correction time is shorter than the RTN cycle, it is possible that the RTN cycle is waited during the error correction processing, and the re-read data may be read in advance.

[Alternative Embodiment]

According to the first embodiment, the memory controller 300 outputs the read error to the host system 100 when the initial erasure correction is failed. When the erasure correction is failed, the erasure correction may be again executed. The memory controller according to the alternative embodiment is different from the first embodiment in that the erasure correction is again executed when the erasure correction is failed.

Figure 11:
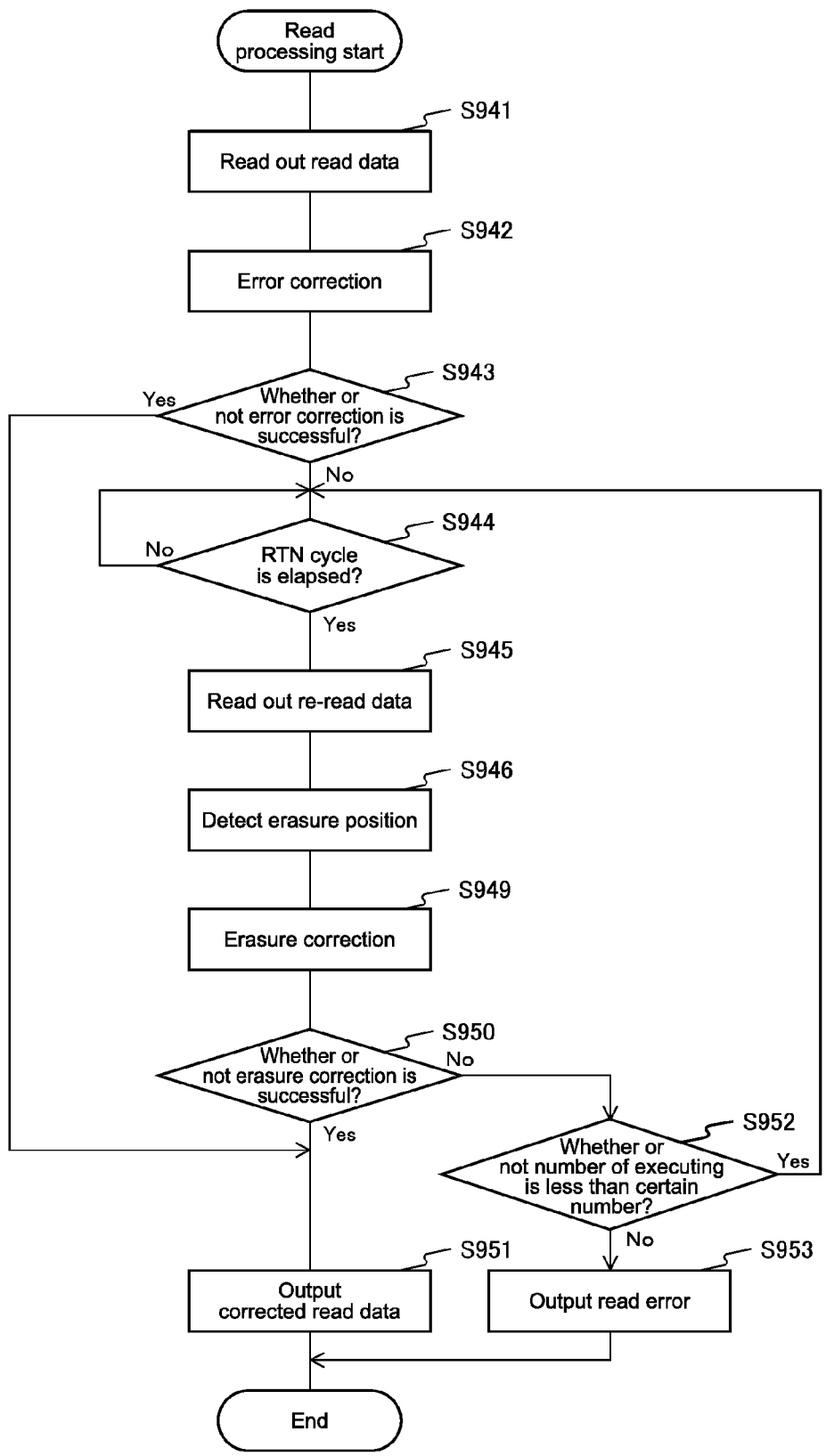
FIG. 11 is a flow chart showing an example of read processing in an alternative embodiment of the first embodiment.

FIG. 11 is a flow chart showing an example of the read processing in the alternative embodiment of the first embodiment. The read processing according to the alternative embodiment is different from the first embodiment in that Step S952 is further executed.

When the erasure correction is failed (Step S950: No), the memory controller 300 determines whether or not the number of executing the erasure correction is less than the certain number of times (Step S952).

If the number of executing the erasure correction is less than a certain number of times (Step S952: Yes), the memory controller 300 returns to Step S944. On the other hand, if the number of executing the erasure correction exceeds the certain number of times (Step S952: No), the memory controller 300 outputs the read error to the host system 100 and ends the read processing (Step S953).

Thus, according to the alternative embodiment of the first embodiment, the memory controller 300 can execute the erasure correction after one RTN cycle is elapsed from the time to fail the erasure correction. In this way, even if the mismatch generated after the RTN cycle is elapsed cannot be detected or corrected, the memory controller 300 can detect and correct the mismatch generated after the other RTN cycle is elapsed. In addition, also in the alternative embodiment, if the error correction time is shorter than the RTN cycle, it may be possible that the RTN cycle is waited during the error correction processing, and the re-read data may be read in advance, similar to the first embodiment.

<2. Second Embodiment>

[Configuration Example of Read Processing Unit]

In the first embodiment, the memory controller 300 determines that the erasure correction is failed when the mismatch exceeds the error correction capability in the erasure correction. However, the memory controller 300 may replace the number of the mismatch data corresponding to a difference between the error correction capability and the mismatch data number with data having the specified value, and may execute the erasure correction within the error correction capability when the number of the mismatch exceeds the error correction capability. The memory controller 300 according to a second embodiment is different from that according to the first embodiment in that the number of the mismatch data corresponding to a difference between the error correction capability and the mismatch data number is replaced with data having the specified value, and the erasure correction is executed within the error correction capability.

Figure 12:
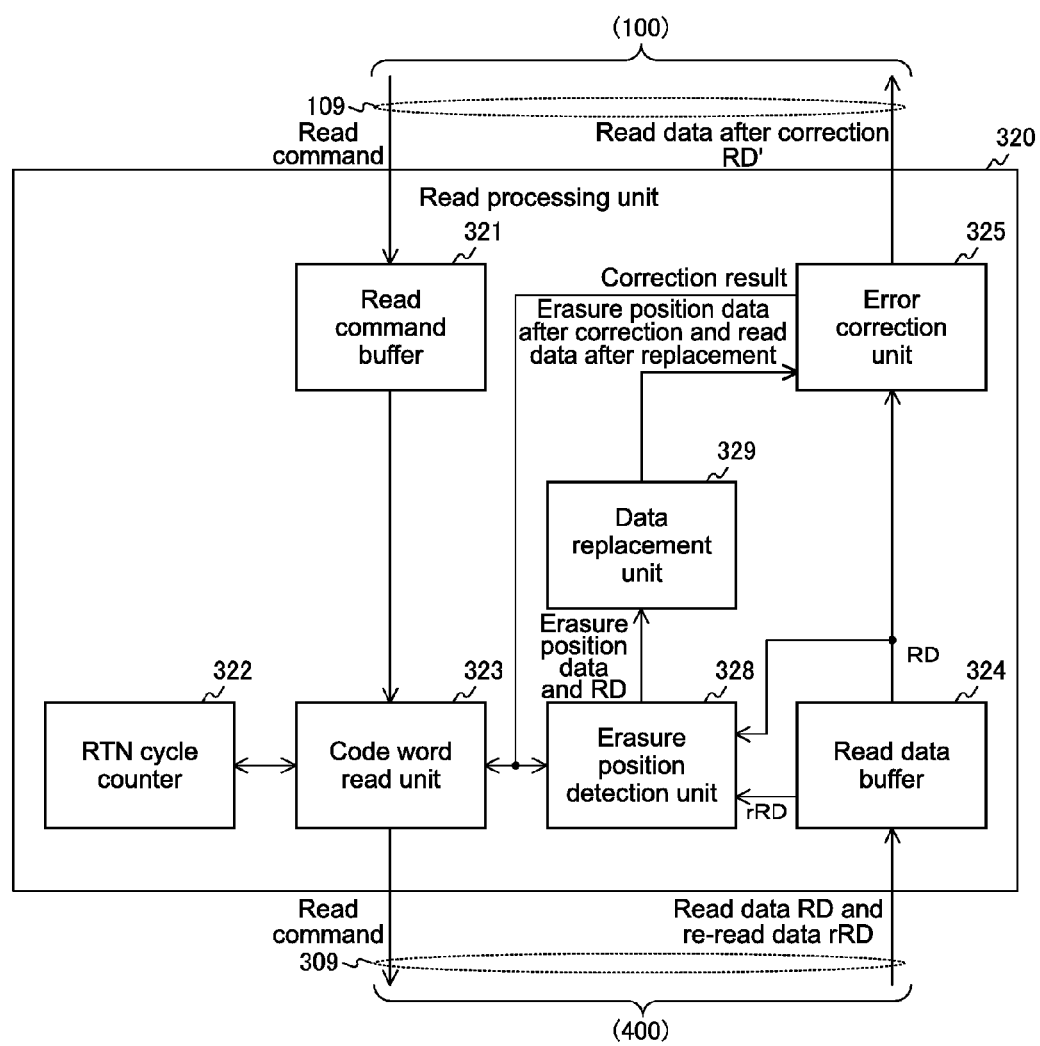
FIG. 12 is a block diagram showing a configuration example of a read processing unit according to a second embodiment.

FIG. 12 is a block diagram showing a configuration example of the read processing unit 320 according to the second embodiment. The read processing unit 320 according to the second embodiment is different from that according to the first embodiment in that a data replacement unit 329 is further included.

The data replacement unit 329 replaces the data at the erasure position where the number exceeds the error correction capability with the data having the certain value. The data replacement unit 329 receives the erasure position data and the read data from the erasure position detection unit 328, and determines whether or not the number h at the erasure position shown by the erasure position data exceeds the error correction capability. Specifically, it is determined whether or not the number at the erasure position is more than $d_{min}-1$ corresponding to the error correction capability. The $d_{min}$ is the minimum hamming distance.

If the h is more than $d_{min}-1$, the data replacement unit 329 replaces the bit with the bit having the specified value ("0" or "1") at the erasure position of $h-(d_{min}-1)$ that is a difference between h and $d_{min}-1$ in the read data. The replacement to the value "1" or "0" is, for example, determined by preliminarily measuring a probability to invert "0" to "1" or "1" to "0" of the data in the memory cells, and determining which is higher. Alternatively, if there is a bias between the probability to invert "0" to "1" and "1" to "0" depending on a device property of the non-volatile memory, the value is replaced with the value having the higher probability. The data replacement unit 329 corrects the erasure position data such that the replaced position has no erasure, and supplies it to the error correction unit 325 together with the read data a part of which is replaced. In this way, the number at the erasure position is less than the error correction capability. Thus, as long as a sum of the number at the erasure position and the error number does not exceed the error correction capability, the error correction unit 325 can correct the error in the read data.

On the other hand, if h is not more than $d_{min}-1$, the erasure correction is possible. The data replacement unit 329 supplies raw read data to the error correction unit 325.

Figure 13A:
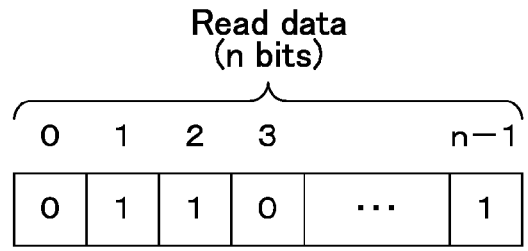
FIGS. 13A, 13B, 13C and 13D are each an example of read data, re-read data, read data after replacement and erasure position data after correction according to the second embodiment.
Figure 13B:
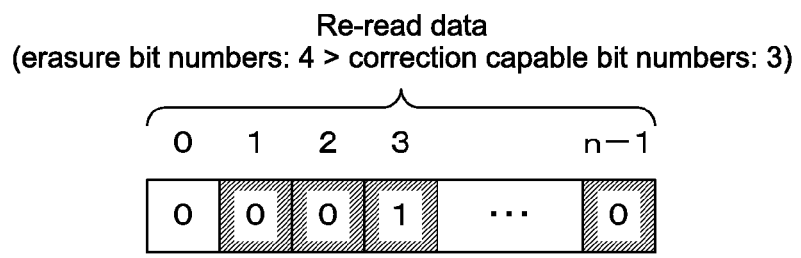

FIGS. 13A, 13B, 13C and 13D each shows an example of the read data, the re-read data, the partly replaced read data and the erasure position data according to the second embodiment. FIG. 13A is an example of the read data. FIG. 13B is an example of the re-read data. The values at 1 to 3 bits and n−1 bits are not matched in the read data and the re-read data. n denotes a data size of the read data.

Figure 13C:
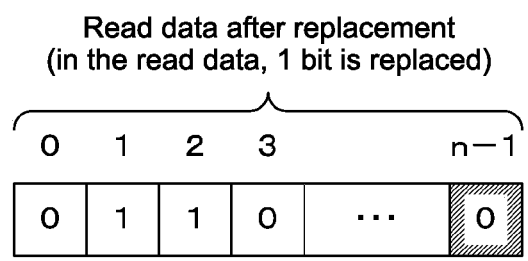

In this case, the erasure position detection unit 328 detects four positions as the erasure positions. If the error correction capability ($d_{min}-1$) is 3 bits, the number at the erasure positions exceeds the error correction capability. The correction may be thus impossible by the erasure correction. In this case, the data replacement unit 329 replaces the bit (1 bit) at the position that is treated as erasure corresponding to a difference between the error correction capability (3 bits) and the number at the erasure positions (4 bits) with the bit having the specified value. FIG. 13C shows an example of the read data after replacement. In the read data, the n−1th bit is replaced with a bit value "0".

Figure 13D:
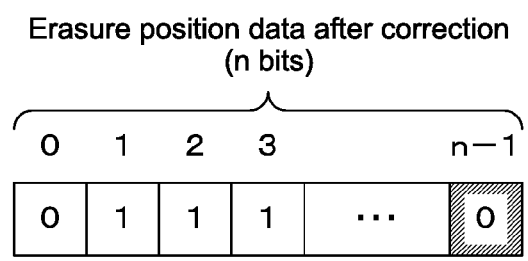

The data replacement unit 329 corrects the erasure position data such that the replaced position has no erasure. FIG. 13D shows an example of the erasure position data after correction. In the erasure position data, the replaced n−1th bit is corrected to bit value "0". The read processing unit 320 replaces the data when the number of the erasure positions exceeds the error correction capability. However, the read processing unit 320 may not replace the data, and may only treat the erasure position that exceeds the error correction capability as no erasure. In this case, the read processing unit 320 does not include the data replacement unit 329, and the erasure position detection unit 328 may correct the h−($d_{min}-1$) bit to "0" in the erasure position data.

[Operation Example of Memory Controller]

Figure 14:
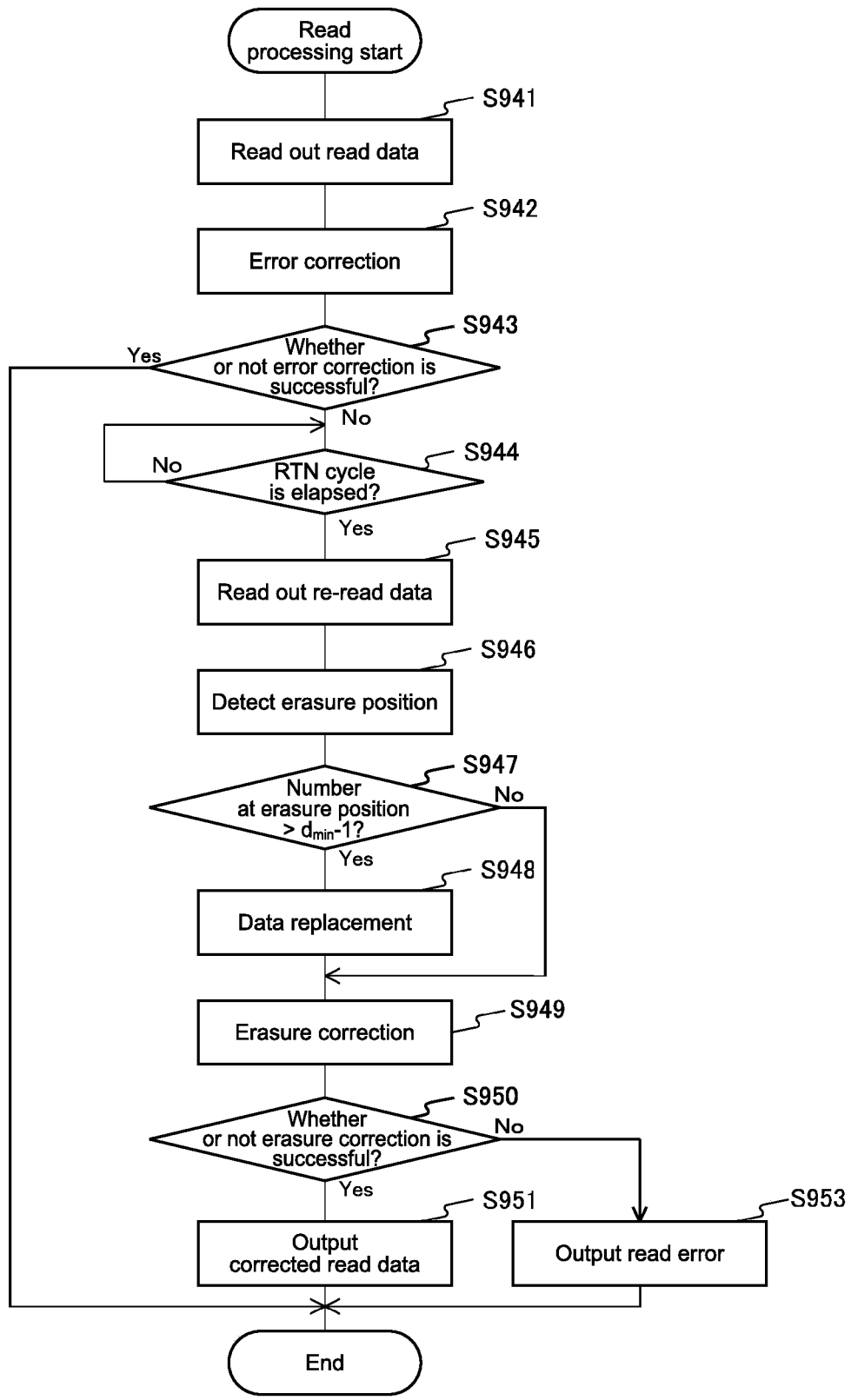
FIG. 14 is a flow chart showing an example of operation of the read processing according to the second embodiment.

FIG. 14 is a flow chart showing an example of operation of the read processing according to the second embodiment. The read processing according to the second embodiment is different from the first embodiment in that Steps S947 and S948 are further executed.

After the erasure position is detected (Step S946), the memory controller 300 determines whether or not the number h at the erasure position exceeds $d_{min}-1$ or not (Step S947). If it exceeds $d_{min}-1$ (Step S947: Yes), the memory controller 300 replaces the data at the h−($d_{min}-1$) erasure position with the data having the specified value. Also, the memory controller 300 corrects the bit corresponding to the replaced position to "0" in the erasure position data (Step S948). If h is not more than $d_{min}-1$ (Step S947: No) or after Step S948, the memory controller 300 executes the erasure correction (Step S949).

As described above, according to the second embodiment, the memory controller 300 replaces the number of the mismatch data corresponding to a difference between the detected erasure position number and the error correction capable error number with data having the specified value. In addition, the memory controller 300 corrects the erasure position data such that no erasure is at the replaced position, and decreases the bit number that is treated as erasure less than the error correction capability. In this way, the memory controller 300 can correct the error in the read data within the error correction capability, even if the number of the erasure positions exceeding the error correction capability is detected.

<3. Third Embodiment>

[Configuration Example of Read Processing Unit]

According to the first embodiment, the memory controller 300 reads out the read data while not controlling a threshold value to determine that the bit value held at the memory address has either of two values. The memory controller 300 may read out the read data while controlling the threshold value. By reading out the read data while controlling the threshold value to a different value, the erasure position caused by a factor other than the random telegraph noise is detected. The read processing unit 320 according to a third embodiment is different from that according to the first embodiment in that the read data is read out while controlling the threshold value.

Figure 15:
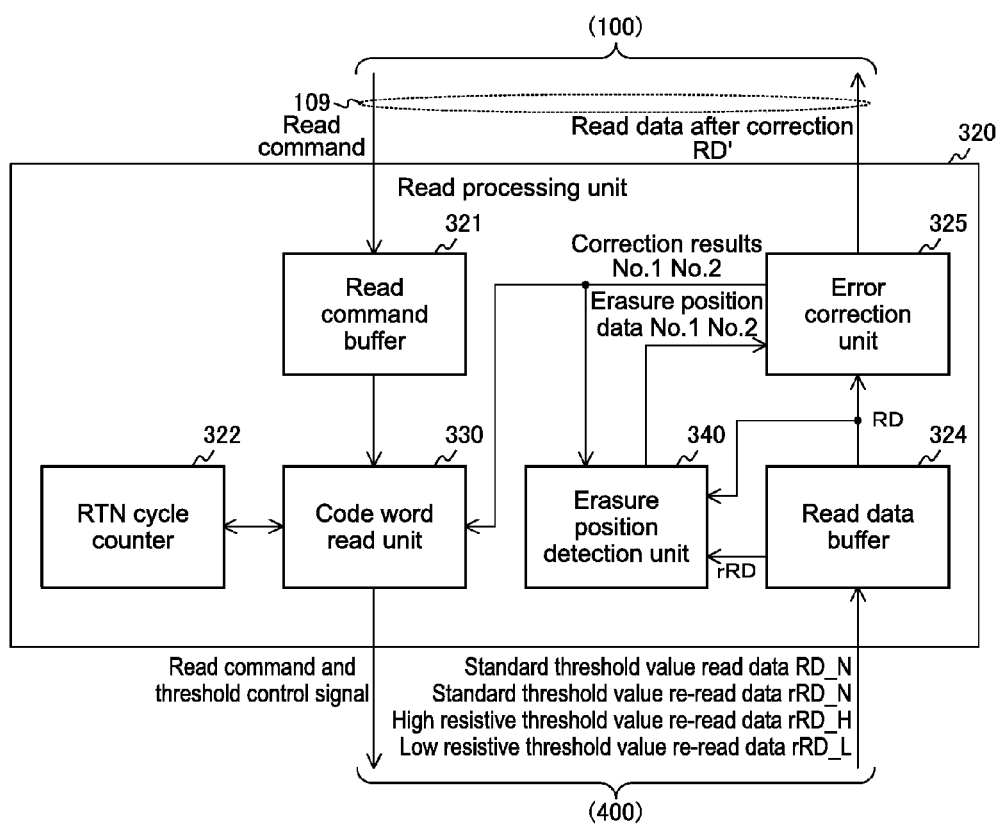
FIG. 15 is a block diagram showing a configuration example of a read processing unit according to a third embodiment.

FIG. 15 is a block diagram showing a configuration example of the read processing unit 320 according to the third embodiment. The read processing unit 320 according to the third embodiment includes a code word read unit 330 and an erasure position detection unit 340 instead of the code word read unit 323 and the erasure position detection unit 328 different from the first embodiment.

The code word read unit 330 outputs a threshold value control signal for controlling the threshold value to the non-volatile memory 400 together with the read command.

When the non-volatile memory 400 is ReRAM, the non-volatile memory 400 includes a plurality of variable resistive elements, and uses a resistance value as the threshold value. These variable resistive elements can record 1 bit data under two states: HRS (High Resistive State) and LRS (Low Resistive State). When the data recorded on these variable resistive elements is read out, the threshold value is generally used to determine either of two states of the variable resistive elements, i.e., either of two values the recorded data has. Such a threshold value is called as "a standard threshold value".

Once the code word read unit 330 receives the read command from the host system 100, the code word read unit 330 reads out the read data from the memory address while controlling the threshold value to the standard threshold value by the threshold value control signal. If the error correction unit 325 fails to correct the read data, the code word read unit 330 reads out the re-read data while controlling the threshold value to a high resistive threshold value set higher than the standard threshold value. Also, the code word read unit 330 reads out the re-read data while controlling the threshold value to a low resistive threshold value set lower than the standard threshold value. Hereinafter, the read data read out by the standard threshold value is called as "standard threshold value read data RD_N". The re-read data read out by the high resistive threshold value is called as "high resistive threshold value re-read data rRD_H". The re-read data read out by the low resistive threshold value is called as "low resistive threshold value re-read data rRD_L".

The erasure position detection unit 340 determines whether or not the value is matched per the bit in the high resistive threshold value re-read data rRD_H and the low resistive threshold value re-read data rRD_L, and detects the position where the value is not matched as the erasure position.

The error correction unit 325 executes the erasure correction based on the erasure position detected from the high resistive threshold value re-read data rRD_H and the low resistive threshold value re-read data rRD_L. If the error correction unit 325 fails to correct the read data, the code word read unit 330 reads out the re-read data using the standard threshold value after the RTN cycle is elapsed from the time to read out the standard threshold value read data RD_N. Hereinafter, the re-read data read out using the standard threshold value is called as "standard threshold value re-read data rRD_N".

The erasure position detection unit 340 detects the erasure position from the standard threshold value read data RD_N and the standard threshold value re-read data rRD_N. The error correction unit 325 executes the erasure correction based on the erasure position.

The code word read unit 330 reads out the high resistive threshold value re-read data rRD_H and the low resistive threshold value re-read data rRD_L, and then reads out the standard threshold value re-read data rRD_N. However, the code word read unit 330 may read out the standard threshold value re-read data rRD_N, and then read out the high resistive threshold value re-read data rRD_H and the low resistive threshold value re-read data rRD_L.

Figure 16:
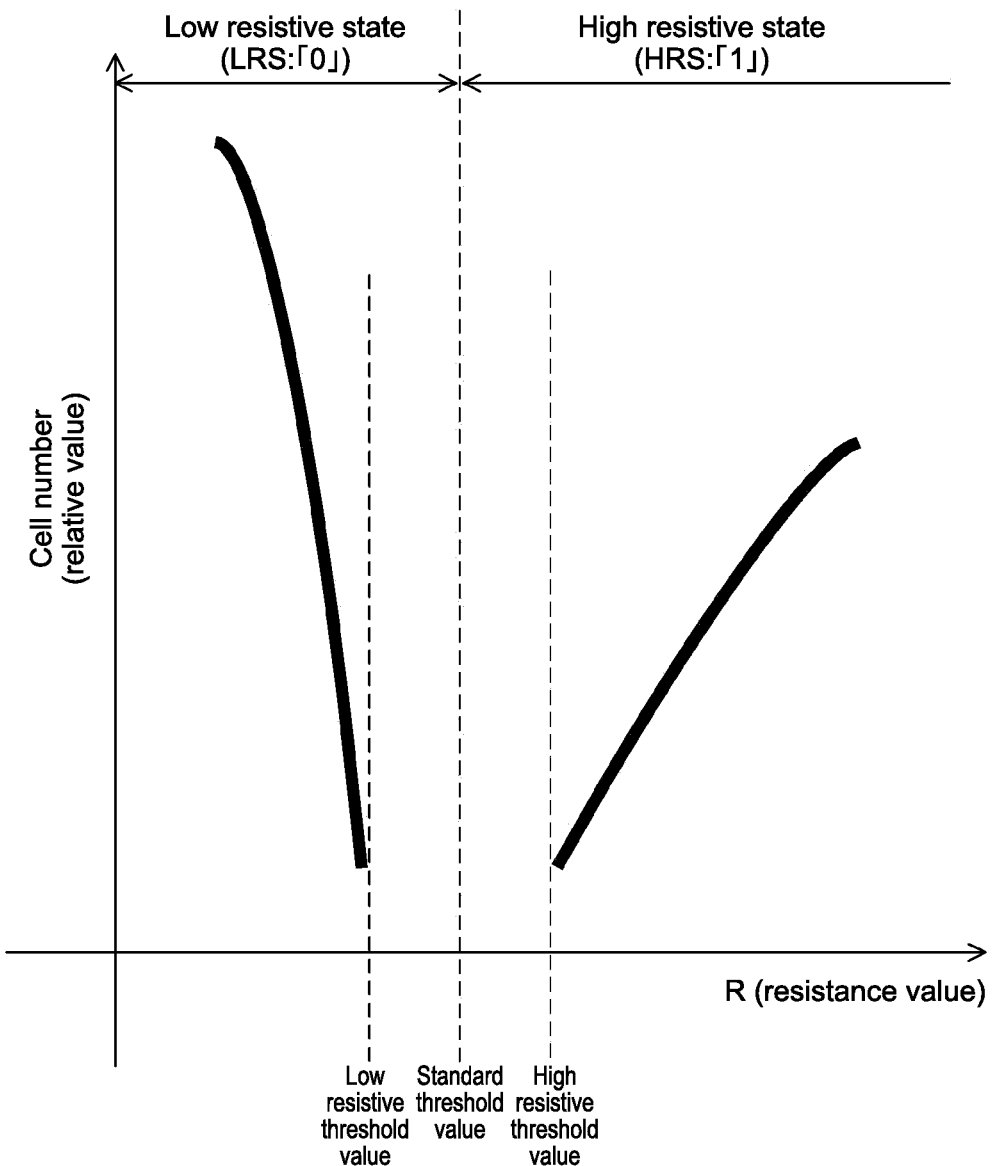
FIG. 16 is a diagram showing an example of a resistance distribution of variable resistive elements according to the third embodiment.

FIG. 16 is a diagram showing an example of a resistance distribution of the variable resistive elements according to the third embodiment. A horizontal axis represents a resistance R, and a vertical axis represents a cell number relative distribution as a relative value. As shown in FIG. 16, the resistance distribution of the variable resistive elements is separated into the LRS and the HRS. In order to separate the High Resistive State and the Low Resistive State, the standard threshold value is generally used.

By associating the High Resistive State and the Low Resistive State of the variable resistive elements with any of a logic 0 value and a logic 1 value, the variable resistive elements function as a memory cell. Any of the logic 0 value and the logic 1 value may be associated with either of the states. For example, the High Resistive State is associated with the logic 1 value, and the Low Resistive State is associated with the logic 0 value.

When the resistance value is relatively low in the HRS and the resistance value is relatively high in the LRS, a data holding property is not good. When the data is read out at the high resistive threshold value and the low resistive threshold value and the values are different, it is presumed that the data holding property of the variable resistive elements may be decreased and the data recorded on the variable resistive elements may be erased.

[Configuration Example of Code Word Read Unit]

Figure 17:
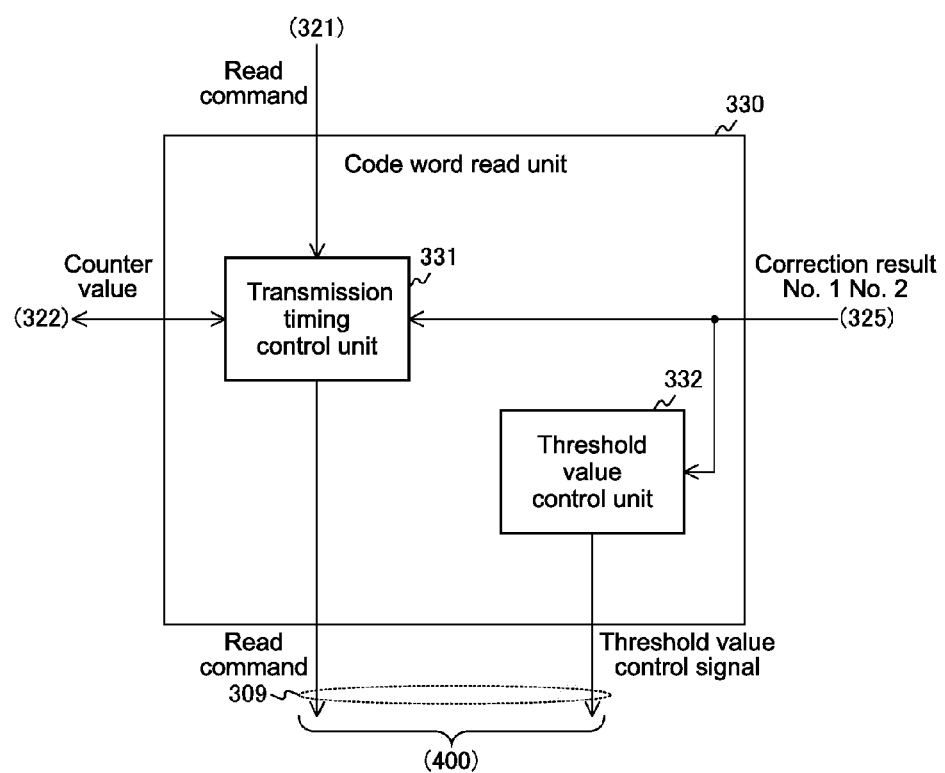
FIG. 17 is a block diagram showing a configuration example of a code word read unit according to the third embodiment.

FIG. 17 is a block diagram showing a configuration example of the code word read unit 330 according to the third embodiment. The code word read unit 330 includes a transmission timing control unit 331 and a threshold value control unit 332.

The transmission timing control unit 331 controls a transmission timing of the read command. The threshold value control unit 332 controls the threshold value by the threshold value control signal.

When the read command is held at the read command buffer 321, the transmission timing control unit 331 outputs the read command to the non-volatile memory 400. On the other hand, the threshold value control unit 332 outputs the threshold control signal for controlling the threshold value to the standard threshold value to the non-volatile memory 400. In this way, the standard threshold value read data RD_N is read out.

When the transmission timing control unit 331 receives a correction result No. 1 showing that the correction is failed, the transmission timing control unit 331 acquires the read command from the read command buffer 321, and outputs the read command twice. On the other hand, when the threshold value control unit 332 receives a correction result No. 1 showing that the correction is failed, the threshold value control unit 332 outputs the threshold value control signal for controlling the threshold value to a high resistive threshold value and the threshold value control signal for controlling the threshold value to a low resistive threshold value sequentially. In this way, the high resistive threshold value re-read data rRD_H and the low resistive threshold value re-read data rRD_L are read out.

Next, when the transmission timing control unit 331 receives a correction result No. 2 showing that the correction is failed, the transmission timing control unit 331 again outputs the read command after the RTN cycle is elapsed from the time to transmit the standard threshold value read data RD_N. The correction result No. 2 is generated after the correction result No. 1 is generated. On the other hand, when the threshold value control unit 332 receives a correction result No. 2 showing that the correction is failed, the threshold value control unit 332 outputs the threshold control signal for controlling the threshold value to the standard threshold value. In this way, the standard threshold value re-read data rRD_N is read out.

[Configuration Example of Erasure Position Detection Unit]

Figure 18:
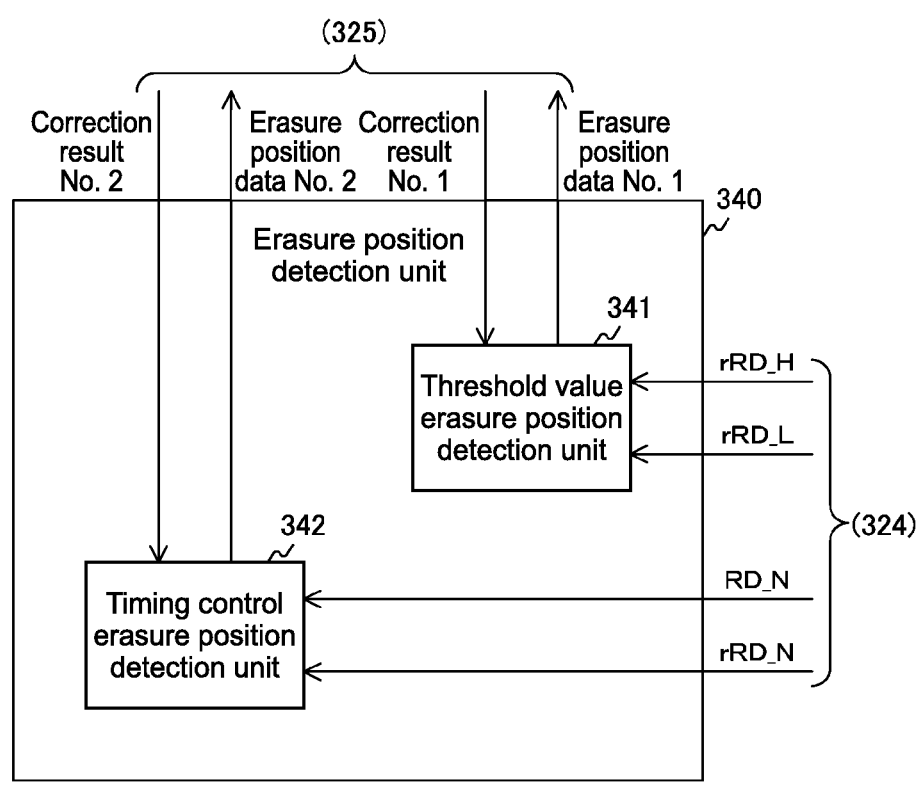
FIG. 18 is a block diagram showing a configuration example of an erasure position detection unit according to the third embodiment.

FIG. 18 is a block diagram showing a configuration example of the erasure position detection unit 340 according to the third embodiment. The erasure position detection unit 340 includes a threshold value erasure position detection unit 341 and a timing control erasure position detection unit 342.

The threshold value erasure position detection unit 341 is for detecting the erasure position from the high resistive threshold value re-read data rRD_H and the low resistive threshold value re-read data rRD_L. When the threshold value erasure position detection unit 341 receives a correction result No. 1 showing that the correction is failed, the threshold value erasure position detection unit 341 acquires the high resistive threshold value re-read data rRD_H and the low resistive threshold value re-read data rRD_L. The threshold value erasure position detection unit 341 detects the erasure position from the data to generate erasure position data No. 1 and supplies it to the error correction unit 325.

The timing control erasure position detection unit 342 is for detecting the erasure position from the standard threshold value read data RD_N and the standard threshold value re-read data rRD_N. When timing control erasure position detection unit 342 receives a correction result No. 2 showing that the correction is failed, the timing control erasure position detection unit 342 acquires the standard threshold value read data RD_N and the standard threshold value re-read data rRD_N. The timing control erasure position detection unit 342 detects the erasure position from the data to generate erasure position data No. 2 and supplies it to the error correction unit 325.

[Operation Example of Memory Controller]

Figure 19:
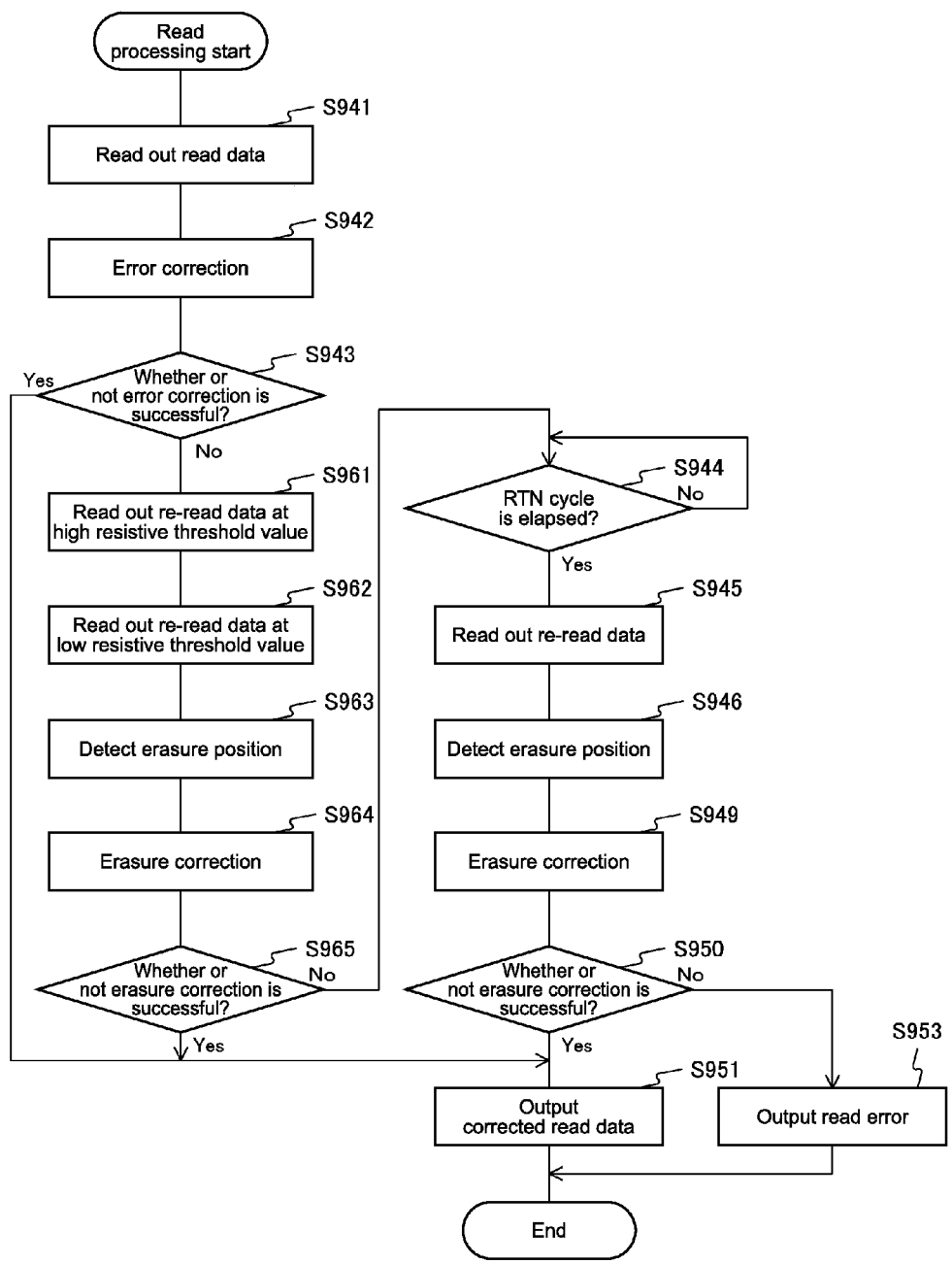
FIG. 19 is a flow chart showing an example of operation of read processing according to the third embodiment.

FIG. 19 is a flow chart showing an example of operation of the read processing according to the third embodiment. The read processing according to the third embodiment is different from the first embodiment in that Steps S961 through S965 are further executed.

If the error correction is failed for the first time (Step S943: No), the memory controller 300 reads out the re-read data at the high resistive threshold value (Step S961). The memory controller 300 reads out the re-read data at the low resistive threshold value (Step S962). The memory controller 300 detects the erasure position from the two re-read data read at the different threshold values (Step S963). The memory controller 300 executes the erasure correction based on the detected erasure position (Step S964). Then, the memory controller 300 determines whether or not the erasure correction is successful (Step S965). If the erasure correction is successful (Step S965: Yes), the memory controller 300 outputs the corrected read data to the host system 100, and ends the read processing. On the other hand, if the erasure correction is failed (Step S965: No), the memory controller 300 executes Step S944.

As described above, according to the third embodiment, the memory controller 300 corrects the error caused by a factor other than the random telegraph noise by detecting the erasure position from the two data read out at the different threshold valued and correcting the code word error.

<4. Fourth Embodiment>

[Configuration Example of Memory Controller]

According to the first embodiment, the memory controller 300 accesses to the non-volatile memory 400 irrespective of the detection result about the mismatch by the RTN. However, the memory controller 300 can control the access to the memory address based on the detection result about the mismatch. The memory controller 300 according to a fourth embodiment is different from the first embodiment in that an access to the memory address is controlled depending on the detection result about the mismatch.

Figure 20:
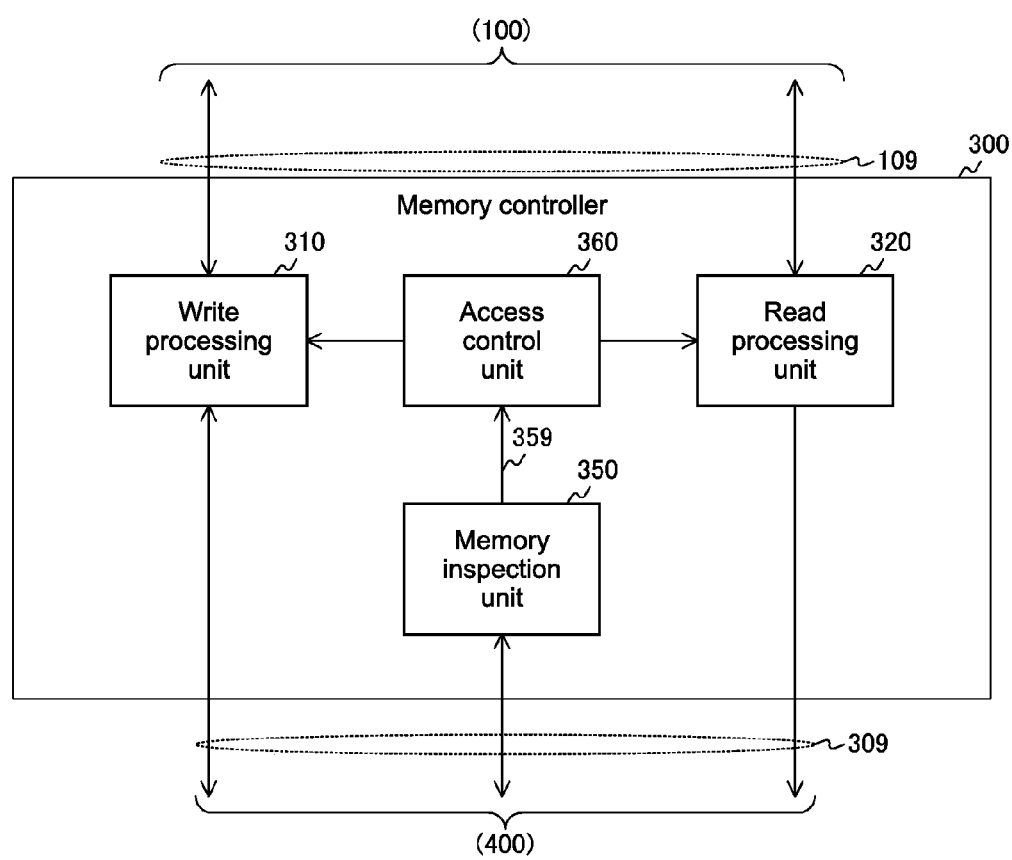
FIG. 20 is a block diagram showing a configuration example of a memory controller according to a fourth embodiment.

FIG. 20 is a block diagram showing a configuration example of the memory controller 300 according to the fourth embodiment. The read controller 300 according to the fourth embodiment is different from that according to the first embodiment in that a memory inspection unit 350 and an access control unit 360 are further included.

The memory inspection unit 350 inspects whether or not the mismatch is generated by the RTN about each memory address in the non-volatile memory 400. The memory inspection unit 350 executes the inspection when the memory controller 300 is activated, for example. The memory inspection unit 350 may execute the inspection at factory or upon repair. During the operation of the memory controller 300 shipped, the inspection may be repeated and executed at a predetermined cycle longer than the RTN cycle.

In the inspection, the memory inspection unit 350 reads out the read data from the memory address to be inspected, and reads out the re-read data after the RTN cycle is elapsed. The memory inspection unit 350 detects the mismatch by the RTN based on the fact that the read data is matched with the re-read data or not. The memory inspection unit 350 detects the mismatch in all memory addresses, and notifies the access control unit 360 via a signal line 359 of the memory addresses having the mismatches as defect addresses.

The memory inspection unit 350 executes the inspection about all memory addresses. However, the memory inspection unit 350 may be configured to execute the inspection about a part of the memory addresses. For example, the memory inspection unit 350 may record an access frequency of each memory address, and inspect only the memory address having the high access frequency.

The access control unit 360 controls an access to the defect address. For example, the access control holds a table where a logic address is associated with a physical address, and registers a flag for showing to the table that the physical address is the defect address or not. Here, the logic address is an address in an address space defined by the host system 100. The physical address is a memory address allocated to each block of the non-volatile memory 400.

Although the memory inspection unit 350 and the access control unit 360 are disposed inside of the memory controller 300, these may be disposed outside of the memory controller 300. The access control unit 360 is an example of the claimed register unit. The memory controller 300 is an example of the claimed mismatch detection apparatus.

The write processing unit 310 according to the fourth embodiment allocates a physical address that is not the defect address to the logic address designated by the write command which is received from the host system 100.

The read processing unit 320 according to the fourth embodiment determines whether or not the physical address corresponding to the logic address designated by the read command received from the host system 100 is the defect address. If the physical address is not the defect address, the read processing unit 320 reads out the read data from the physical address to detect and correct the errors. On the other hand, if the physical address is the defect address, the read processing unit 320 outputs the read error to the host system 100.

Although the memory inspection unit 350 determines the memory address where the mismatch is detected once as the defect address, a plurality of inspections may be made per the memory address. When a rate of incidence of mismatches exceeds a certain value, the memory address may be determined as the defect address. Also, the memory inspection unit 350 may register the memory address where the number of the erasure positions exceeds the error detection capability as the defect address. In this case, the memory inspection unit 350 may generate the erasure position data similar to the first embodiment, and determine whether or not the number of the erasure positions shown by the data exceeds the error correction capability.

[Configuration Example of Memory Inspection Unit]

Figure 21:
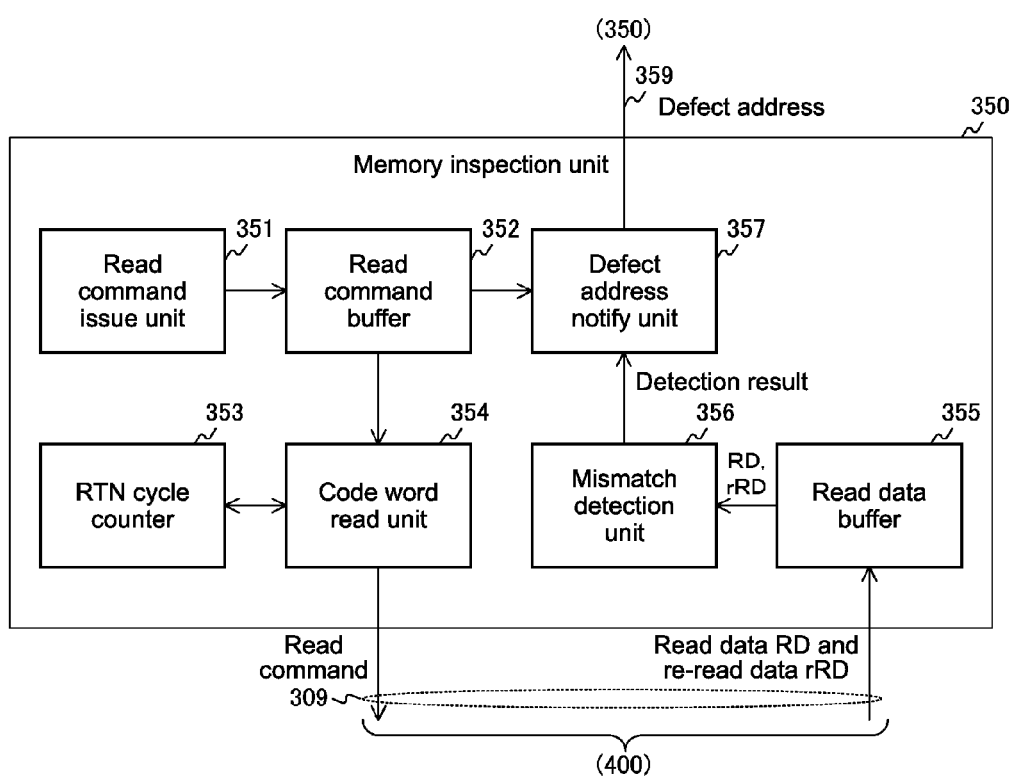
FIG. 21 is a block diagram showing a configuration example of a memory inspection unit according to the fourth embodiment.

FIG. 21 is a block diagram showing a configuration example of the memory inspection unit 350 according to the fourth embodiment. The memory inspection unit 350 includes a read command issue unit 351, a read command buffer 352, an RTN cycle counter 353, a code word read unit 354, a read data buffer 355, a mismatch detection unit 356 and a defect address notify unit 357.

The read command issue unit 351 issues the read command for reading out the data from the memory address to be inspected. For example, the read command issue unit 351 inspects all memory addresses, sequentially issues the read command for designating them, and makes it the read command buffer 352 to be held.

The configurations of the read command buffer 352, the RTN cycle counter 353 and the read data buffer 335 are similar to those of the read command buffer 321, the RTN cycle counter 322 and the read data buffer 324 according to the first embodiment.

The code word read unit 354 reads out the read data and the re-read data per the memory address. The code word read unit 354 outputs each of the read commands held on the read command buffer 352 to the non-volatile memory 400 twice at RTN cycle intervals. In this way, the read data and the re-read data are read out per the memory address.

The mismatch detection unit 356 detects the mismatch by the RTN based on the fact that the read data is matched with the re-read data or not. The mismatch detection unit 356 detects the mismatch per the memory address, and supplies detection results to the defect address notify unit 357.

The defect address notify unit 357 notifies the memory address where the mismatch is detected as the defect address to the access control unit 360. The defect address notify unit 357 acquires the read command corresponding to the read data where the mismatch is detected from the read command buffer 352, and notifies the memory address designated by the read command as the defect address to the access control unit 360.

[Operation Example of Memory Controller]

Figure 22:
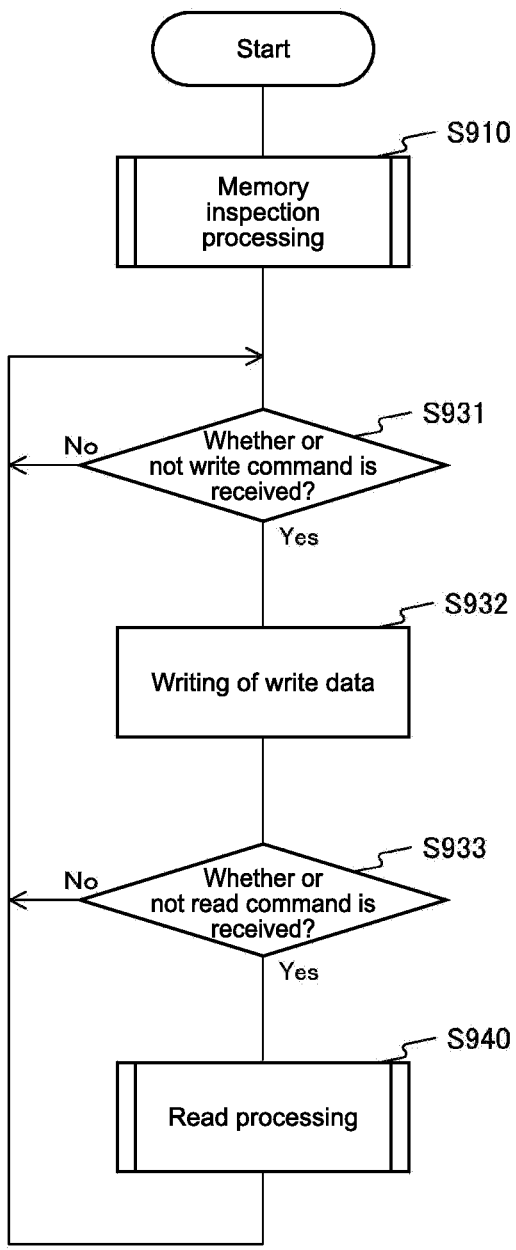
FIG. 22 is a flow chart showing an example of operation of a memory controller according to the fourth embodiment.

FIG. 22 is a flow chart showing an example of operation of the memory controller according to the fourth embodiment. The operation of the memory controller 300 according to the fourth embodiment is different from the first embodiment in that Step S910 is further executed.

The memory controller 300 firstly executes memory inspection processing for inspecting the non-volatile memory (Step S910), and then executes Steps S931 to S933 and S940.

Figure 23:
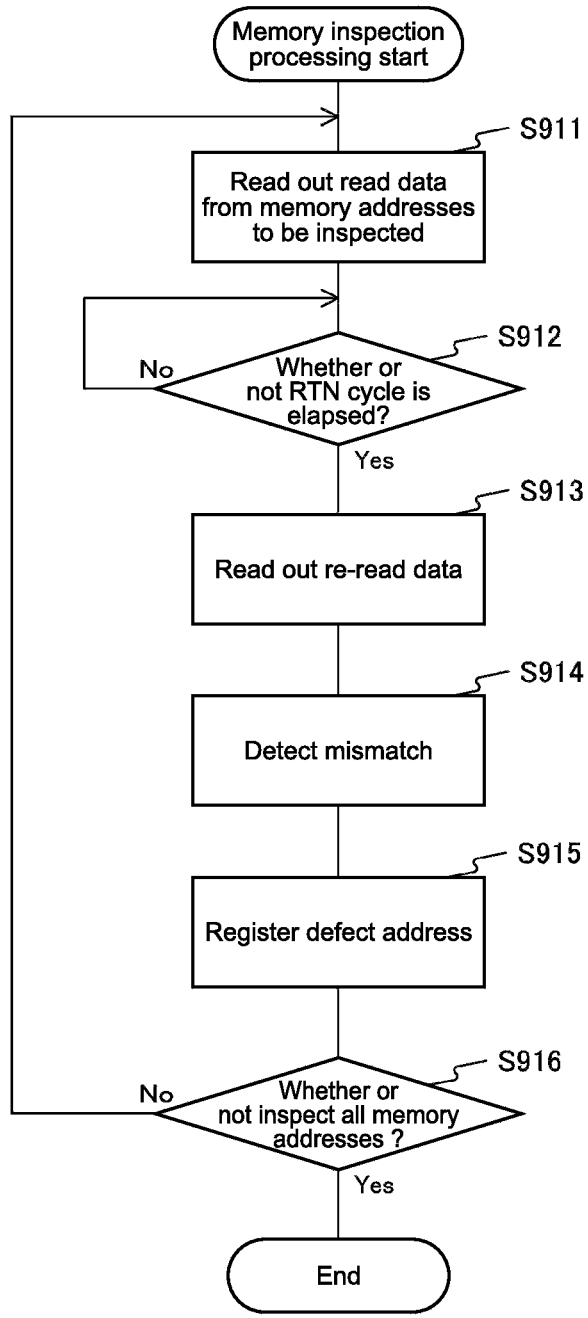
FIG. 23 is a flow chart showing an example of memory inspection processing according to the fourth embodiment.

FIG. 23 is a flow chart showing an example of the memory inspection processing according to the fourth embodiment. The memory controller 300 reads out the read data from any of the memory addresses to be inspected (Step S911). Then, the memory controller 300 determines whether or not the RTN cycle is elapsed from the time to read out the read data (Step S912). If the RTN cycle is not elapsed (Step S912: No), the memory controller 300 returns to Step S912. On the other hand, if the RTN cycle is elapsed (Step S912: Yes), the memory controller 300 reads out the re-read data (Step S913).

The memory controller 300 detects the mismatch by the RTN based on the fact that the read data is matched with the re-read data or not (Step S914). The memory controller 300 registers the memory address where the mismatch is detected as the defect address, and limits subsequent accesses (Step S915). The memory controller 300 determines whether or not all memory addresses are inspected (Step S916). If all memory addresses are not inspected (Step S916: No), the memory controller 300 returns to Step S911. On the other hand, if all memory addresses are inspected (Step S916: Yes), the memory controller 300 ends the memory inspection processing.

In this way, according to the fourth embodiment, the memory controller 300 can detect the mismatch by the random telegraph noise from the read data and the re-read data. Then, the memory controller 300 registers the memory address where the mismatch is generated as the defect address, thereby limiting access to the address.

<5. Fifth Embodiment>

[Configuration Example of Memory Controller]

According to the first embodiment, the data error is corrected based on a predetermined RTN cycle value. However, the cycle where a detection frequency of the mismatch becomes highest may be changed by a property variation per product of the non-volatile memory 400, temperature conditions etc. The predetermined RTN cycle may be different from an actual RTN cycle value. It is therefore desirable that the memory controller 300 itself measures the detection frequency of the mismatch by the RTN in the non-volatile memory 400 and sets the RTN cycle depending on a measured value. The memory controller 300 according to a fifth embodiment is different from that according to the first embodiment in that the RTN cycle is set depending on the measured value.

Figure 24:
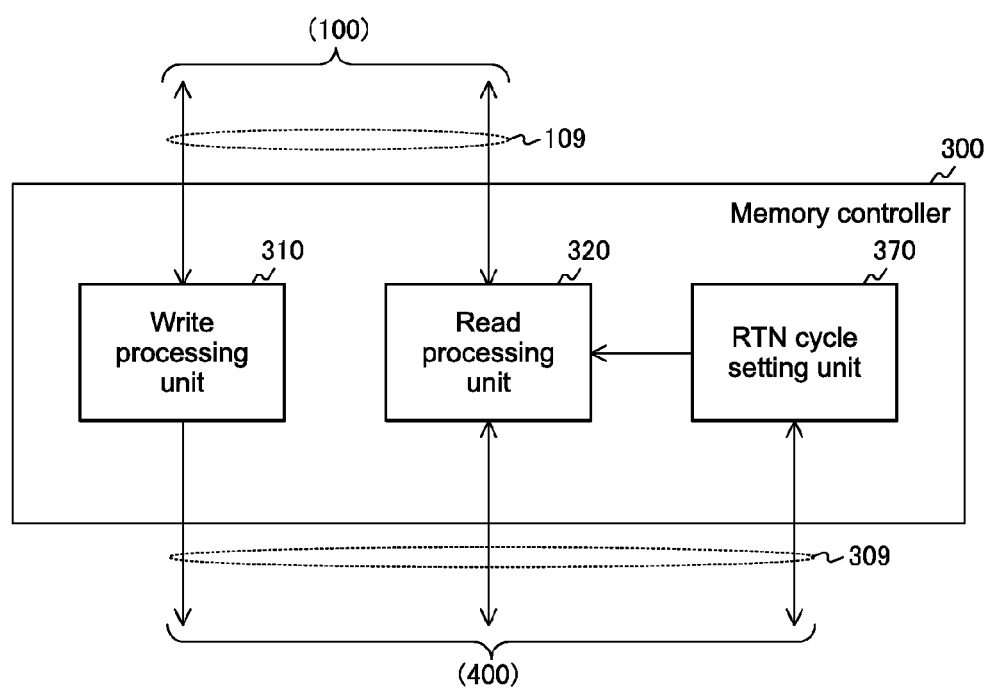
FIG. 24 is a block diagram showing a configuration example of a memory controller according to a fifth embodiment.

FIG. 24 is a block diagram showing a configuration example of the memory controller 300 according to the fifth embodiment. The memory controller 300 according to the fifth embodiment further includes the RTN cycle setting unit 370 different from the first embodiment.

The RTN cycle setting unit 370 determines the RTN cycle depending on the detection frequency of the mismatch by the RTN, and sets the RTN cycle to the read processing unit 320. The RTN cycle setting unit 370 sets the RTN cycle when the memory controller 300 is activated, for example. Also, the RTN cycle setting unit 370 may set the RTN cycle at factory or upon repair, or may execute setting processing of the RTN cycle during the operation of the memory controller 300 shipped in a constant period longer than the RTN cycle.

In the RTN cycle setting, the RTN cycle setting unit 370 sets a cycle having a predetermined cycle as a candidate cycle of the RTN cycle, and reads out the code word as the read data from any memory addresses. Then, the RTN cycle setting unit 370 reads out the code word as the re-read data from the same memory address after the candidate cycle is elapsed. The RTN cycle setting unit 370 detects the mismatch by the RTN by whether or not the read data is matched with the re-read data. The RTN cycle setting unit 370 executes the detection processing of the mismatch for certain times. Then, the RTN cycle setting unit 370 changes the length of the candidate cycle, and executes the detection processing of the mismatch for certain times by the similar procedure.

The RTN cycle setting unit 370 picks up the cycle having the greatest number of detecting the mismatches among a plurality of candidate cycles as the RTN cycle, and sets its value to the read processing unit 320. When the RTN cycle is set by the RTN cycle setting unit 370, the read processing unit 320 according to the fifth embodiment reads out the re-read data based on the value.

The RTN cycle setting unit 370 is configured to be disposed inside of the memory controller 300. However, it may be disposed outside of the memory controller 300. The RTN cycle setting unit 370 is an example of the claimed mismatch detection apparatus.

[Configuration Example of RTN Cycle Setting Unit]

Figure 25:
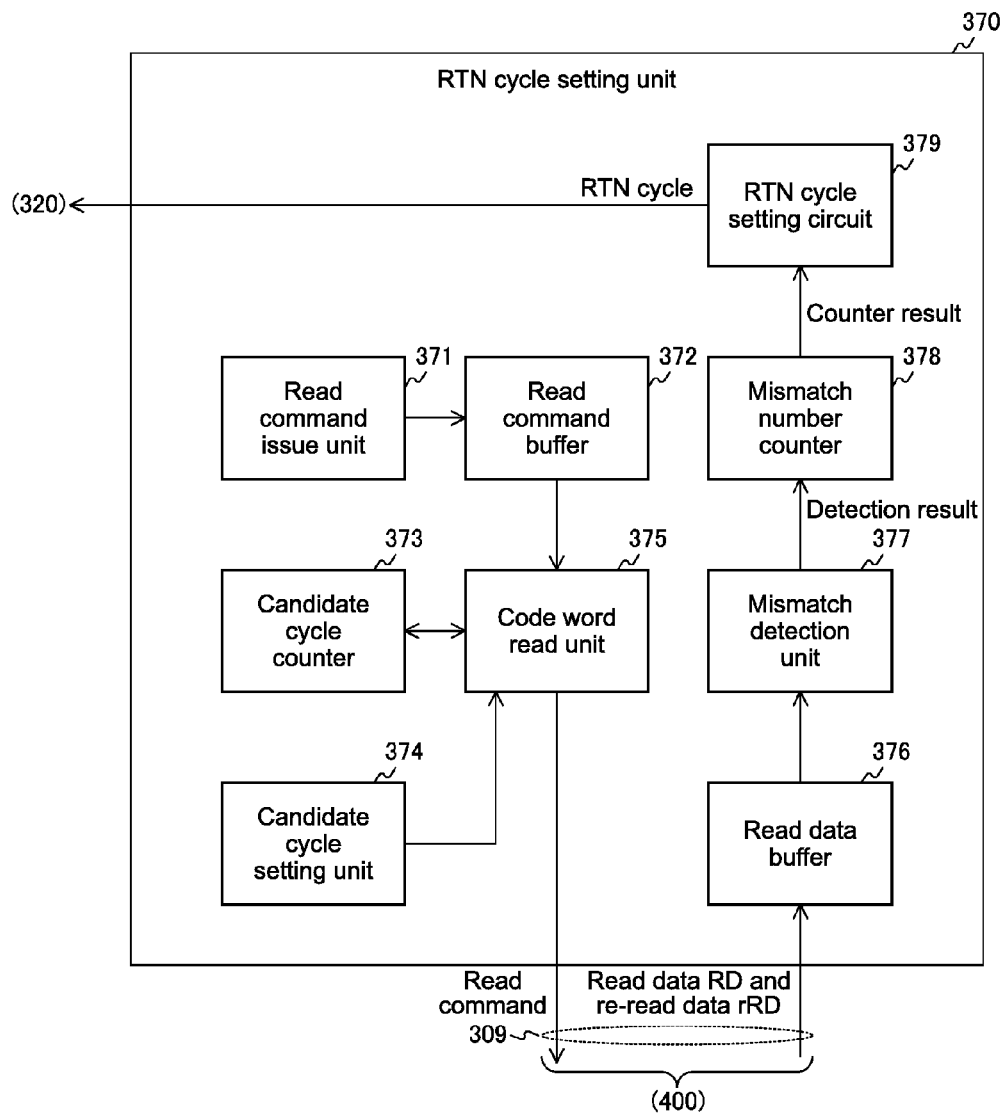
FIG. 25 is a block diagram showing a configuration example of an RTN cycle setting unit according to the fifth embodiment.

FIG. 25 is a block diagram showing a configuration example of the RTN cycle setting unit 370 according to the fifth embodiment. The RTN cycle setting unit 370 includes a read command issue unit 371, a read command buffer 372, a candidate cycle counter 373, a candidate cycle setting unit 374 and a code word read unit 375. Also, the RTN cycle setting unit 370 includes a read data buffer 376, a mismatch detection unit 377, a mismatch number counter 378 and an RTN cycle setting circuit 379.

The read command issue unit 371 issues the read command for designating any memory address. The read command issue unit 371 holds the issued read command in the read command buffer 372.

The configurations of the read command buffer 372 and the read data buffer 376 are similar to those of the read command buffer 321 and the read data buffer 324 according to the first embodiment.

The candidate cycle counter 373 counts the candidate cycle. The candidate cycle setting unit 374 sets any of a plurality of times having different length as the candidate cycle. The candidate cycle setting unit 374 supplies the set candidate cycle to the code word read unit 375.

The code word read unit 375 reads out the read data and the re-read data from the designated memory address. The code word read unit 375 executes the reading out processing of the read data and the re-read data for certain times based on the candidate cycle each time the candidate cycle is set.

The mismatch detection unit 377 detects the mismatch by the RTN by whether or not the read data and the re-read data are matched each time they are read out. The mismatch detection unit 377 supplies the detection result of the mismatch to the mismatch number counter 378.

The mismatch number counter 378 counts the number of the mismatch per the candidate cycle. The mismatch number counter 378 supplies the counted results to the RTN cycle setting circuit 379.

The RTN cycle setting circuit 379 sets the cycle having the greatest number of mismatch detection as the RTN cycle among a plurality of candidate cycles. The RTN cycle setting circuit 379 supplies the value of the set RTN cycle to the RTN cycle counter 322 in the read processing unit 320.

The mismatch detection unit 377 does not detect the mismatch per the bit in the read data and the re-read data, but may detect the mismatch per the bit. In this case, the mismatch detection unit 377 generates the erasure position data similar to the first embodiment, and supplies the data to the mismatch number counter 378. Then, the mismatch number counter 378 counts the number of the erasure positions as the number of mismatch per one time. If the number of the mismatch detection is a plurality of times, the mismatch number counter 378 outputs a total number of the mismatch number each detection as the counter result to the RTN cycle setting circuit 379.

Figure 26:
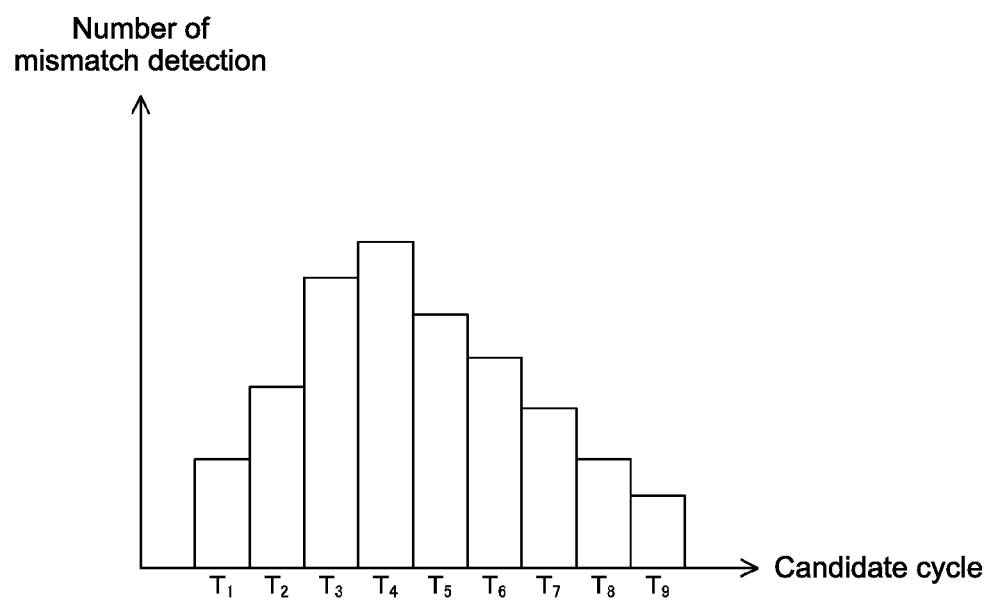
FIG. 26 is a histogram showing an example of a counter result of a mismatch number per an RTN cycle according to the fifth embodiment.

FIG. 26 is a histogram showing an example of the counter result of the mismatch number per the RTN cycle according to the fifth embodiment. A horizontal axis represents the number of the mismatch detection, and a vertical axis represents the candidate cycle. Among $T_1$ to $T_9$ cycles having different lengths, the number of the mismatch detection in $T_4$ cycle is the greatest. In this case, $T_4$ cycle is used as the RTN cycle.

[Operation Example of Memory Controller]

Figure 27:
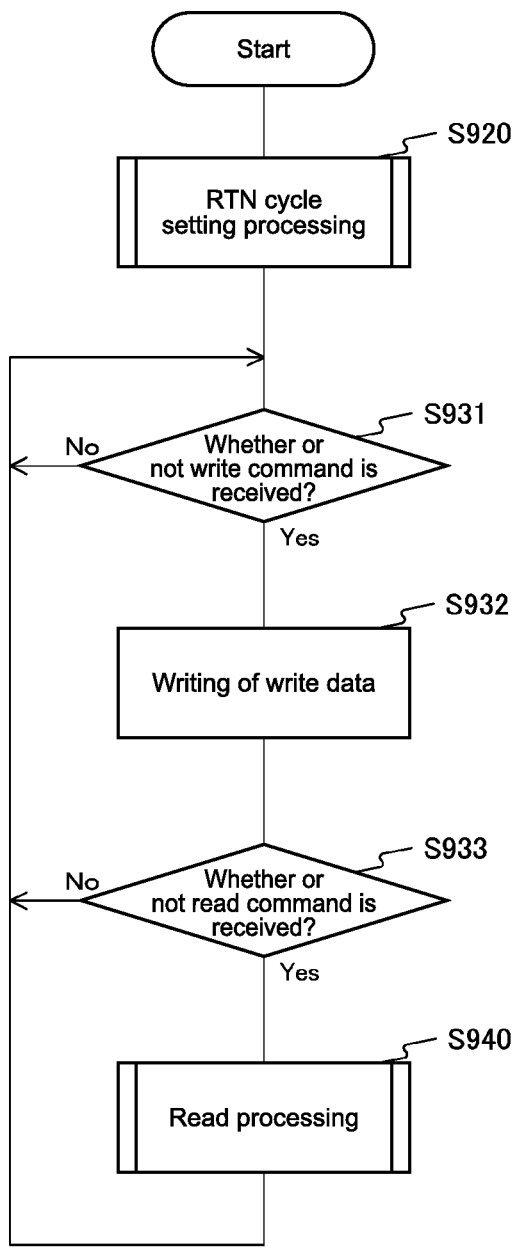
FIG. 27 is a flow chart showing an example of operation of a memory controller according to the fifth embodiment.

FIG. 27 is a flow chart showing an example of operation of the memory controller 300 according to the fifth embodiment. The operation of the memory controller 300 according to the fifth embodiment is different from the first embodiment in that Step S920 is further executed.

The memory controller 300 firstly executes the RTN cycle setting processing for setting the RTN cycle (Step S920), and then executes Steps S931 to S933 and S940.

Figure 28:
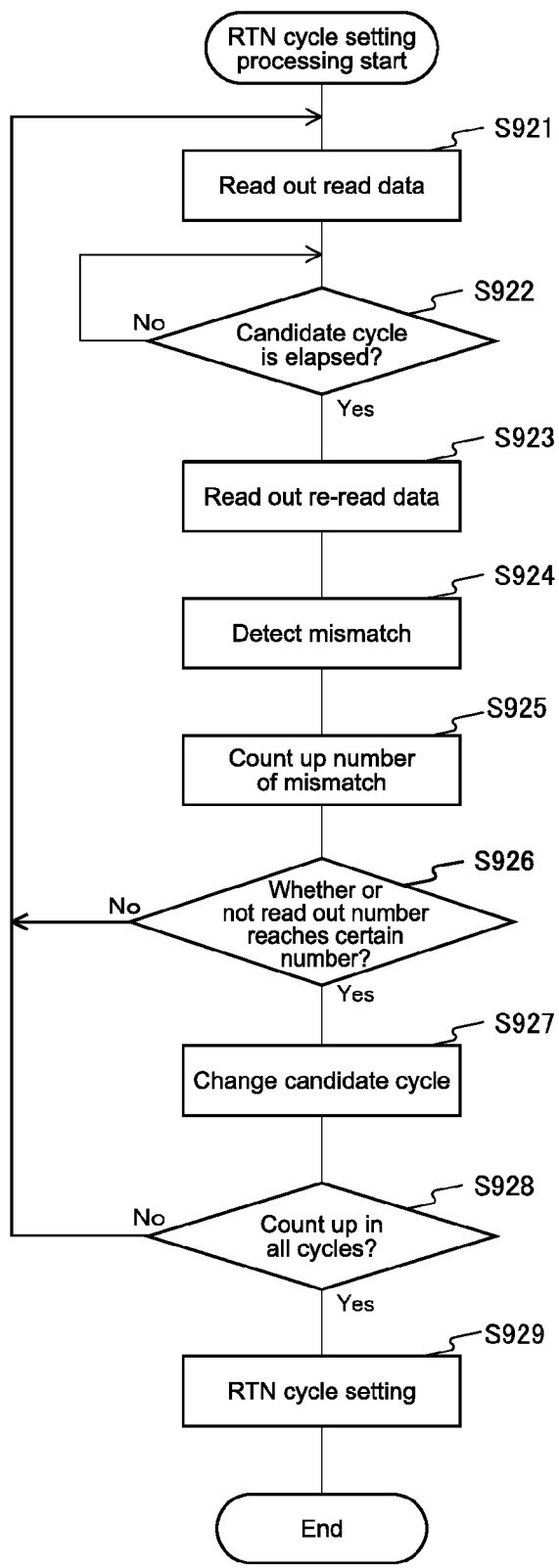
FIG. 28 is a flow chart showing an example of an RTN cycle according to the fifth embodiment.

FIG. 28 is a flow chart showing an example of the RTN cycle according to the fifth embodiment. The memory controller 300 reads out the read data from any of the memory addresses (Step S921). Then, the memory controller 300 determines whether or not the candidate cycle is elapsed from the time to read out the read data (Step S922). If the candidate cycle is not elapsed (Step S922: No), the memory controller 300 returns to Step S922. If the candidate cycle is elapsed (Step S922: Yes), the memory controller 300 reads out the re-read data (Step S923). The memory controller 300 detects the mismatch by the RTN by whether or not the read data and the re-read data are matched (Step S924). If the mismatch is detected, the memory controller 300 counts up the number of the mismatch detection in the candidate cycle (Step S925).

Then, the memory controller 300 determines whether or not the read out number of the read data and the re-read data in the candidate cycle reaches the certain number of times (Step S926). If the read out number does not reach the certain number of times (S926: No), the memory controller 300 returns to Step S921. If the read out number reaches the certain number of times (Step S926: Yes), the memory controller 300 changes the candidate cycle (Step S927).

The memory controller 300 determines whether or not the number of the mismatch detection is calculated in all of a plurality of candidate cycles having different lengths (Step S928). If the number of the mismatch detection is not calculated in all of the cycles (Step S928: No), the memory controller 300 returns to Step S921. If the number of the mismatch detection is calculated in all of the cycles (Step S928: Yes), the memory controller 300 sets the candidate cycle where the number of the mismatch detection (a detection frequency) is highest as the RTN cycle (Step S929). After Step S929, the memory controller 300 ends the RTN cycle setting processing.

In this way, according to the fifth embodiment, the memory controller 300 can measure the detection frequency of the mismatch by the RTN of the non-volatile memory 400 to be controlled, and set the RTN cycle depending on the measured value. Thus, the memory controller 300 can correct more accurately the error of the data.

<6. Sixth Embodiment>

[Configuration Example of Memory Controller]

In the first embodiment, the memory controller 300 detects the erasure positions based on the constant RTN cycle. However, the length of the RTN cycle may be changed depending on the temperature. The memory controller 300 according to a sixth embodiment is different from the first embodiment in that the length of the RTN cycle is changed depending on the temperature.

Figure 29:
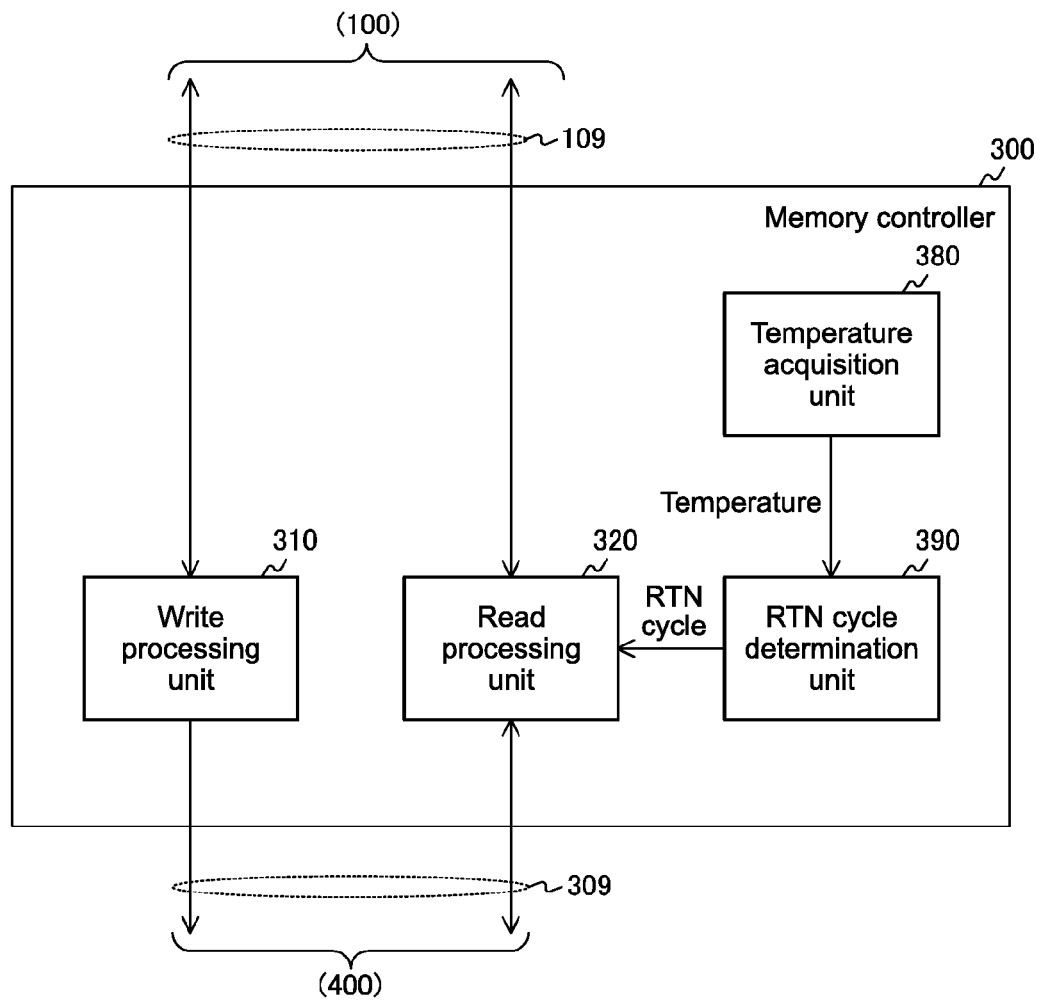
FIG. 29 is a block diagram showing a configuration example of a memory controller according to a sixth embodiment.

FIG. 29 is a block diagram showing a configuration example of the memory controller 300 according to the sixth embodiment. The memory controller 300 according to the sixth embodiment is different from the first embodiment in that a temperature acquisition unit 380 and an RTN cycle determination unit 390 are further included.

The temperature acquisition unit 380 acquires the temperature measured by a temperature sensor within the non-volatile memory 400. The temperature acquisition unit 380 supplies the acquired temperature to the RTN cycle determination unit 390.

The RTN cycle determination unit 390 determines the length of the RTN cycle depending on the temperature. The RTN cycle determination unit 390 determines the length of the RTN cycle at a certain frequency longer than the RTN cycle, for example.

In general, when the temperature is higher, an incidence rate of a variety of noises such as the random telegraph noise is increased in the non-volatile memory 400. Therefore, the RTN cycle determination unit 390 shortens the RTN cycle when the temperature is higher. The RTN cycle determination unit 390 supplies the RTN cycle having the length determined to the read processing unit 320.

The read processing unit 320 according to the sixth embodiment receives the value of the RTN cycle from the RTN cycle determination unit 390, and reads out the re-read data based on the value.

Although the temperature acquisition unit 380 and the RTN cycle determination unit 390 are disposed inside of the memory controller 300, one or both of them may be disposed outside of the memory controller 300.

In this way, according to the sixth embodiment, the memory controller 300 can change the length of the RTN cycle depending on the temperature. Thus, the memory controller 300 can correct accurately the data by the RTN cycle depending on the current temperature, even if the temperature is changed.

The above-described embodiments show examples for embodying the present technology, and there is a correspondence relation between the mattes in the embodiments and the matters to define the claimed invention. Similarly, there is a correspondence relation between the matters to define the claimed invention and the matters in the embodiments of the present technology having the same title. The present technology is not limited to the above-described embodiments, and may be embodied by offering variations and modifications without departing from the spirit of the present invention.

The procedures described in the above-described embodiments may be regarded as methods including a series of the procedures, or may be regarded as programs for executing a series of the procedures by a computer or a recording medium that records the programs. As the recording medium, a CD (Compact Disc), an MD (Minidisc), a DVD (Digital Versatile Disk), a memory card, a Blue-ray Disc™ and the like can be used.

The present technology may have the following configurations.

[1] An error detection and correction apparatus, including:
a code word read-out unit to execute read processing to read out a code word including a plurality of code elements that improve error correction capability by detection of an erasure position as read data from a memory address and to execute re-read processing to read out the code word as re-read data from the memory address after a predetermined time is elapsed from the time to read out the read data;
a timing control erasure position detection unit to detect a position of the code element having a value not matched as the erasure position in the code word by determining whether or not the value is matched per the code word in the read data and the re-read data; and
an error correction unit to correct an error based on the erasure position in the code word where the erasure position is detected.

[2] The error detection and correction apparatus according to [1], in which
the error correction unit corrects the error such that the number of positions that correspond to a difference between a total number of the erasure positions and the predetermined number among the detected erasure positions is not the erasure position when the total number of the detected erasure positions exceeds the predetermined number corresponding to the error correction capability.

[3] The error detection and correction apparatus according to [2], further including:
a data replacement unit that replaces the code element with data having a certain value at the erasure position where the number corresponding to the difference and supplies it to the error correction unit when the total number of the detected erasure positions exceeds the predetermined number,
the error correction unit correcting the error such that the position replaced with the data having the certain value is not the erasure position.

[4] The error detection and correction apparatus according to [3], in which
the certain value is determined based on a probability to invert one value of two values of the code element to the other value and a probability to invert the other value of the code element to the one value.

[5] The error detection and correction apparatus according to any of [1] to [4], further including:
a threshold value control read-out unit to control a threshold value to a first value for determining the value of the code element held at the memory address having either of two values, to read out the code word from the memory address as first data, to control the threshold value to a second value different from the first value, and to read out the code word from the memory address as second data; and
a threshold value control erasure position detection unit to determine whether or not the value is matched per the code element in the first and second data and to detect the position of the code element having the value not matched as the erasure position in the code word,
the error correction unit correcting the error in the cord word where the erasure position is detected by the timing control erasure position detection unit, and the cord word where the erasure position is detected by the threshold value control erasure position detection unit.

[6] The error detection and correction apparatus according to any of [1] to [5], further including:

a read data error detection unit to detect an error in the read data when the code word read-out unit executes the read processing,
the code word read-out unit executing the re-read processing when the error is detected by the read data error detection unit.

[7] The error detection and correction apparatus according to any of [1] to [6], further including:
a temperature acquisition unit to acquire a temperature; and
a determination unit to determine a length of the predetermined time depending on the temperature before the read processing is executed,
the code word read-out unit executing the read processing when the length of the predetermined time is determined.

[8] A mismatch detection apparatus, including:
a code word read-out unit to execute read processing to read out a code word including a plurality of code elements as read data from a memory address and to execute re-read processing to read out the code word as re-read data from the memory address after a predetermined time is elapsed from the time to read out the read data;
a mismatch detection unit to detect whether or not the read data and the re-read data are mismatched; and
a register unit to register the memory address where the mismatch is detected as a defect address to which an access is inhibited.

[9] The error detection and correction apparatus according to [8], in which
the mismatch detection unit to determine whether or not the value is mismatched per the code element, and
the register unit registers the memory address as the defect address when the number of the code element that is determined as a mismatch exceeds a predetermined threshold value.

[10] A mismatch detection apparatus, including:
a supply unit to supply a plurality of times having different lengths as candidate times sequentially;
a code word read-out unit to execute read processing to read a code word including a plurality of code elements from a memory address as read data and re-read processing to read out the code words from the memory address as re-read data after the candidate time is elapsed from the time to read out the read data a certain number of times every time the candidate times are set;
a mismatch detection unit to detect whether or not the read data and the re-read data are mismatched each time the read processing and the re-read processing are executed;
a counter to count the number of times of the mismatch detection in the plurality of times; and
a setting unit to set the time having a highest detection frequency of the mismatch from the plurality of times based on the detection number of times.

[11] A memory system, including:
a memory to store a code word including a plurality of code elements that improves error correction capability by detection of an erasure position to a memory address;
a code word read-out unit to execute read processing to read out a code word including a plurality of code elements as read data from a memory address and to execute re-read processing to read out the code word as re-read data from the memory address after a predetermined time is elapsed from the time to read out the read data;
a timing control erasure position detection unit to detect a position of the code element having the value not matched as the erasure position in the code word by determining whether or not the value is matched per the code word in the read data and the re-read data; and an error correction unit to correct an error based on the erasure position in the code word where the erasure position is detected.

[12] A method of correcting an error, including:

a code word read out procedure by a code word read-out unit to execute read processing to read out a code word including a plurality of code elements as read data from a memory address and to execute re-read processing to read out the code word as re-read data from the memory address after a predetermined time is elapsed from the time to read out the read data;

a timing control erasure position detection procedure by a timing control erasure position detection unit to detect a position of the code element having the value not matched as the erasure position in the code word by determining whether or not the value is matched per the code word in the read data and the re-read data; and an error correction procedure by an error correction unit to correct an error based on the erasure position in the code word where the erasure position is detected.

It should be understood by those skilled in the art that various modifications, combinations, sub-combinations and alterations may occur depending on design requirements and other factors insofar as they are within the scope of the appended claims or the equivalents thereof.

What is claimed is:

1. An error detection and correction apparatus, comprising:
    a code word read-out unit to execute read processing to read out a code word including a plurality of code elements that improve error correction capability by detection of an erasure position as read data from a memory address and to execute re-read processing to read out the code word as re-read data from the memory address after a predetermined time is elapsed from the time to read out the read data;
    a timing control erasure position detection unit to detect a position of the code element having a value not matched as the erasure position in the code word by determining whether or not the value is matched per the code word in the read data and the re-read data; and
    an error correction unit to correct an error based on the erasure position in the code word where the erasure position is detected.

2. The error detection and correction apparatus according to claim 1, wherein the error correction unit corrects the error such that the number of positions that correspond to a difference between a total number of the erasure positions and the predetermined number among the detected erasure positions is not the erasure position when the total number of the detected erasure positions exceeds the predetermined number corresponding to the error correction capability.

3. The error detection and correction apparatus according to claim 2, further comprising:
    a data replacement unit that replaces the code element with data having a certain value at the erasure position where the number corresponding to the difference and supplies it to the error correction unit when the total number of the detected erasure positions exceeds the predetermined number,
    the error correction unit correcting the error such that the position replaced with the data having the certain value is not the erasure position.

4. The error detection and correction apparatus according to claim 3, wherein the certain value is determined based on a probability to invert one value of two values of the code element to the other value and a probability to invert the other value of the code element to the one value.

5. The error detection and correction apparatus according to claim 1, further comprising:
    a threshold value control read-out unit to control a threshold value to a first value for determining the value of the code element held at the memory address having either of two values, to read out the code word from the memory address as first data, to control the threshold value to a second value different from the first value, and to read out the code word from the memory address as second data; and
    a threshold value control erasure position detection unit to determine whether or not the value is matched per the code element in the first and second data and to detect the position of the code element having the value not matched as the erasure position in the code word,
    the error correction unit correcting the error in the cord word where the erasure position is detected by the timing control erasure position detection unit, and the cord word where the erasure position is detected by the threshold value control erasure position detection unit.

6. The error detection and correction apparatus according to claim 1, further comprising:
    a read data error detection unit to detect an error in the read data when the code word read-out unit executes the read processing,
    the code word read-out unit executing the re-read processing when the error is detected by the read data error detection unit.

7. The error detection and correction apparatus according to claim 1, further comprising:
    a temperature acquisition unit to acquire a temperature; and
    a determination unit to determine a length of the predetermined time depending on the temperature before the read processing is executed,
    the code word read-out unit executing the read processing when the length of the predetermined time is determined.

8. A mismatch detection apparatus, comprising:
    a code word read-out unit to execute read processing to read out a code word including a plurality of code elements as read data from a memory address and to execute re-read processing to read out the code word as re-read data from the memory address after a predetermined time is elapsed from the time to read out the read data;
    a mismatch detection unit to detect whether or not the read data and the re-read data are mismatched; and
    a register unit to register the memory address where the mismatch is detected as a defect address to which an access is inhibited.

9. The error detection and correction apparatus according to claim 8, wherein the mismatch detection unit to determine whether or not the value is mismatched per the code element, and wherein the register unit registers the memory address as the defect address when the number of the code element that is determined as a mismatch exceeds a predetermined threshold value.

10. A mismatch detection apparatus, comprising:
    a supply unit to supply a plurality of times having different lengths as candidate times sequentially;
    a code word read-out unit to execute read processing to read a code word including a plurality of code elements from a memory address as read data and re-read processing to read out the code words from the memory address as re-read data after the candidate time is elapsed from the time to read out the read data a certain number of times every time the candidate times are set;

a mismatch detection unit to detect whether or not the read data and the re-read data are mismatched each time the read processing and the re-read processing are executed;

a counter to count the number of times of the mismatch detection in the plurality of times; and a setting unit to set the time having a highest detection frequency of the mismatch from the plurality of times based on the detection number of times.

11. A memory system, comprising:

a memory to store a code word including a plurality of code elements that improves error correction capability by detection of an erasure position to a memory address;

a code word read-out unit to execute read processing to read out a code word including a plurality of code elements as read data from a memory address and to execute re-read processing to read out the code word as re-read data from the memory address after a predetermined time is elapsed from the time to read out the read data;

a timing control erasure position detection unit to detect a position of the code element having the value not matched as the erasure position in the code word by determining whether or not the value is matched per the code word in the read data and the re-read data; and an error correction unit to correct an error based on the erasure position in the code word where the erasure position is detected.

12. A method of correcting an error, comprising:

a code word read out procedure by a code word read-out unit to execute read processing to read out a code word including a plurality of code elements as read data from a memory address and to execute re-read processing to read out the code word as re-read data from the memory address after a predetermined time is elapsed from the time to read out the read data;

a timing control erasure position detection procedure by a timing control erasure position detection unit to detect a position of the code element having the value not matched as the erasure position in the code word by determining whether or not the value is matched per the code word in the read data and the re-read data; and an error correction procedure by an error correction unit to correct an error based on the erasure position in the code word where the erasure position is detected.

* * * * *